(12) United States Patent
Kim et al.

(10) Patent No.: US 12,161,033 B2
(45) Date of Patent: Dec. 3, 2024

(54) DISPLAY DEVICE AND CONNECTION CIRCUIT BOARD

(71) Applicant: Samsung Display Co., Ltd., Yongin-si (KR)

(72) Inventors: Wontae Kim, Hwaseong-si (KR); Myeongsu Kim, Hwaseong-si (KR); Boyeon Kim, Seoul (KR); Jae-Han Lee, Hwaseong-si (KR); Whee-Won Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/366,046

(22) Filed: Aug. 7, 2023

(65) Prior Publication Data

US 2024/0023393 A1   Jan. 18, 2024

Related U.S. Application Data

(63) Continuation of application No. 17/950,210, filed on Sep. 22, 2022, now Pat. No. 11,770,954, which is a continuation of application No. 17/318,051, filed on May 12, 2021, now Pat. No. 11,476,321.

(30) Foreign Application Priority Data

Sep. 24, 2020 (KR) .................. 10-2020-0124039

(51) Int. Cl.
*H10K 59/131* (2023.01)
*G09G 3/3208* (2016.01)

(52) U.S. Cl.
CPC ......... *H10K 59/131* (2023.02); *G09G 3/3208* (2013.01); *G09G 2300/0426* (2013.01)

(58) Field of Classification Search
CPC .. H10K 59/131; G09G 3/3208; G09G 3/3258; G09G 3/3291
See application file for complete search history.

(56) References Cited

U.S. PATENT DOCUMENTS

| 10,219,385 | B2 | 2/2019 | Jang et al. |
| 10,403,689 | B2 | 9/2019 | Park et al. |
| 10,476,185 | B2 | 11/2019 | Kim ..................... H05K 1/09 |

(Continued)

FOREIGN PATENT DOCUMENTS

| KR | 1020110014033 A | 2/2011 |
| KR | 1020180008999 A | 1/2018 |

(Continued)

*Primary Examiner* — Sardis F Azongha
(74) *Attorney, Agent, or Firm* — CANTOR COLBURN LLP

(57) ABSTRACT

A display device includes a display panel including an edge extending along a first direction, a main circuit board adjacent to the edge of the display panel, and a connection circuit board which connects the main circuit board to the display panel at the edge thereof. The connection circuit board includes a plurality of board side pads which are arranged along the first direction and at which the connection circuit board is connected to the main circuit board. Each of the plurality of board side pads includes a first pad, and a second pad adjacent to the first pad along the first direction. The second pad includes a plurality of signal pads which are arranged along a second direction which crosses the first direction and are each aligned with the first pad along the first direction.

17 Claims, 14 Drawing Sheets

(56) References Cited

U.S. PATENT DOCUMENTS

| | | |
|---|---|---|
| 10,546,909 B2 | 1/2020 | Lee .................... H01L 27/3276 |
| 2011/0032687 A1 | 2/2011 | Song |
| 2017/0263165 A1 | 9/2017 | Guo et al. |
| 2018/0020550 A1 | 1/2018 | Jang et al. |
| 2019/0371691 A1 | 12/2019 | Han et al. |
| 2020/0258971 A1 | 8/2020 | Oh .................... G02F 1/136286 |

FOREIGN PATENT DOCUMENTS

| | | |
|---|---|---|
| KR | 1020190041564 A | 4/2019 |
| KR | 1020190137482 A | 12/2019 |

DISPLAY DEVICE AND CONNECTION CIRCUIT BOARD

This application is a continuation application of U.S. application Ser. No. 17/950,210 filed Sep. 22, 2022, which is a continuation application of U.S. application Ser. No. 17/318,051 filed May 12, 2021 and issued as U.S. Pat. No. 11,476,321 on Oct. 18, 2022, which claims priority to Korean Patent Application No. 10-2020-0124039, filed on Sep. 24, 2020, and all the benefits accruing therefrom under 35 U.S.C. § 119, the entire contents of which are hereby incorporated by reference.

BACKGROUND

(1) Field

The disclosure herein relates to a display device and a connection circuit board thereof. More particularly, the disclosure herein relates to a display device having improved reliability and a connection circuit board of the display device.

(2) Description of the Related Art

In general, a display panel is manufactured, and then a circuit board is connected to the display panel. For example, a tape automated bonding ("TAB") mounting method bonds the circuit board to the display panel such by using a conductive adhesive member ("ACF").

Display devices having rigidity and a reduced bezel area (or a non-display area) are being researched.

SUMMARY

The disclosure provides a display device including a connection circuit board that is applicable to a high resolution display device and reduces or effectively prevents a defect such as short circuit between pads of the display device.

An embodiment provides a display device including a display panel including a plurality of panel pads (e.g., display pads) arranged in a first direction, a connection circuit board including a plurality of panel side pads (e.g., output pads) arranged in the first direction and electrically connected to the plurality of panel pads, respectively, and a plurality of board side pads (e.g., input pads) arranged in the first direction and spaced apart from the plurality of panel pads, and a main circuit board including a plurality of board pads (e.g., circuit pads) electrically connected to the plurality of board side pads, respectively, and arranged in the first direction. Here, the plurality of board side pads include a first pad, and a second pad that overlaps the first pad in the first direction. Also, the second pad includes a plurality of vertical arrangement pads (e.g., plurality of signal pads) arranged in a second direction crossing the first direction, and an additional pad (e.g., additional signal pad) adjacent to the plurality of vertical arrangement pads in the second direction.

In an embodiment, each of the board side pads may receive a signal from the main circuit board, and each of the panel side pads may transmit the signal to the display panel.

In an embodiment, each of the plurality of vertical arrangement pads may include a connection part (e.g., connection portion) extending in the second direction, and a pad part (e.g., pad portion) extending from the connection part in the first direction.

In an embodiment, the plurality of vertical arrangement pads may include a first vertical arrangement pad and a second vertical arrangement pad (e.g., first signal pad and second signal pad). Here, the first vertical arrangement pad may include a first connection part (e.g., first connection portion) extending in the second direction, and a first pad part (e.g., first pad portion) extending from the first connection part in the first direction and on a first virtual line extending in the first direction, and the second vertical arrangement pad may include a second connection part (e.g., second connection portion) extending in the second direction, and a second pad part (e.g., second pad portion) extending from the second connection part in the first direction and on a second virtual line that is spaced further apart from the main circuit board than the first virtual line. Also, the first pad may overlap the first and second virtual lines, the first pad part may not overlap the second virtual line, and the second pad part may not overlap the first virtual line.

In an embodiment, the additional pad may not overlap the first virtual line and the second virtual line.

In an embodiment, a length of the first vertical arrangement pad in the second direction may be greater than that of the second vertical arrangement pad in the second direction.

In an embodiment, the additional pad may include a first portion between the first vertical arrangement pad and the second vertical arrangement pad in the second direction, and a second portion spaced apart from the first vertical arrangement pad with the second vertical arrangement pad therebetween in the second direction.

In an embodiment, the plurality of vertical arrangement pads may further include a third vertical arrangement pad (e.g., third signal pad), and the third vertical arrangement pad may include a third connection part (e.g., third connection portion) extending in the second direction, and a third pad part (e.g., third pad portion) extending from the third connection part in the first direction and on a third virtual line spaced further apart from the main circuit board than each of the first virtual line and the second virtual line. Here, the third pad part may not overlap the first virtual line and the second virtual line.

In an embodiment, a width of the second pad in the first direction may be greater than that of the first pad in the first direction.

In an embodiment, a width of the additional pad in the first direction may be greater than that of the first pad in the first direction.

In an embodiment, the plurality of board pads may include a first board pad (e.g., first circuit pad) electrically connected with the first pad, and a second board pad (e.g., second circuit pad) electrically connected with the second pad, and a width of the second board pad in the first direction is greater than that of the first board pad in the first direction.

In an embodiment, the second board pad may overlap the additional pad and at least a portion of the plurality of vertical arrangement pads on a plane.

In an embodiment, the connection circuit board may further include a plurality of lines (e.g., input signal lines) each having one end connected to each of the plurality of second pads, and a driving circuit connected to the other end of each of the plurality of lines.

In an embodiment, a length of each of the vertical arrangement pads in the second direction may be less than that of the first arrangement pad in the second direction.

In an embodiment, the additional pad may receive a power voltage from the main circuit board.

In an embodiment, a length of the additional pad in the second direction may be less than that of the first pad in the second direction.

In an embodiment, a display device includes a display panel, a connection circuit board including a plurality of board side pads arranged in a first direction, and a main circuit board including a plurality of board pads electrically connected to the plurality of board side pads, respectively, and arranged in the first direction. Here, the plurality of board side pads include a first pad having a first width in the first direction, and a second pad that overlaps the first pad in the first direction and has a second width greater than the first width in the first direction. Also, the second pad includes, a plurality of vertical arrangement pads arranged in a second direction crossing the first direction, and an additional pad disposed adjacent to the plurality of vertical arrangement pads in the second direction.

In an embodiment, a connection circuit board includes a plurality of first row pads (e.g., output pads) arranged in a first direction, and a plurality of second row pads (e.g., input pads) arranged in the first direction and spaced apart from the plurality of first row pads. Here, the plurality of second row pads include a first pad, and a second pad spaced apart from the first pad in the first direction and having a width greater than that of the first pad in the first direction. Also, the second pad includes a plurality of vertical arrangement pads arranged in a second direction crossing the first direction, and an additional pad disposed adjacent to the plurality of vertical arrangement pads in the second direction.

In an embodiment, the connection circuit board may further include a plurality of lines each having one end connected to each of the plurality of second row pad, and a driving circuit connected to the other end of each of the plurality of lines.

In an embodiment, the plurality of vertical arrangement pads may include a first vertical arrangement pad on a first virtual line extending in the first direction, and a second vertical arrangement pad on a second virtual line that is parallel to the first virtual line and disposed closer to the driving circuit than the first virtual line. Here, the first pad may overlap the first and second virtual lines, the first vertical arrangement pad may not overlap the second virtual line, and the second vertical arrangement pad may not overlap the first virtual line.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1A:
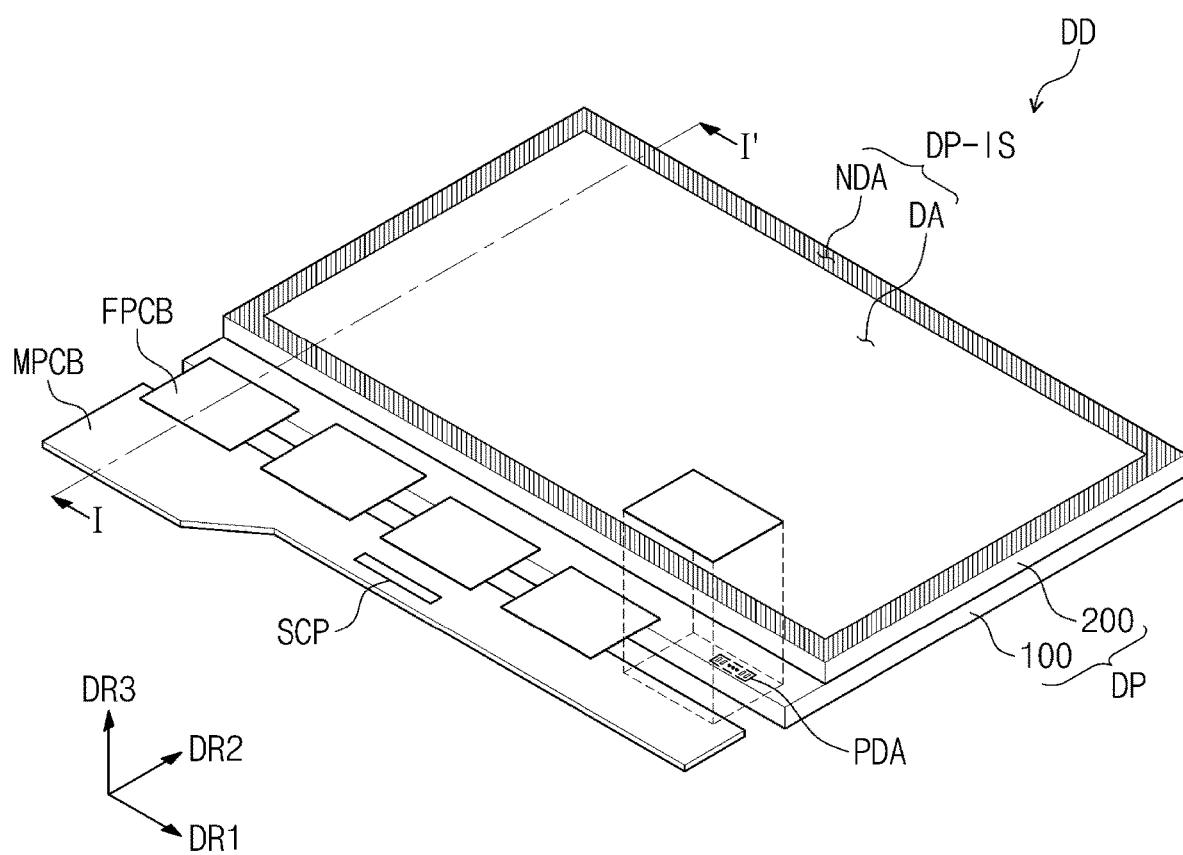
FIG. 1A is a perspective view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. Also, in the figures, the thickness, ratio, and dimensions of components are exaggerated for clarity of illustration.

Hereinafter, embodiments will be described with reference to the accompanying drawings. It will be understood that when an element such as a region, layer, or portion is referred to as being related to another element such as being "on" another element, it can be directly on the other element or intervening elements may also be present. In contrast, when an element such as a region, layer, or portion is referred to as being related to another element such as being "directly on" another element, no other element or intervening element is present.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under," "below," "above," "upper" and the like are used for explaining relation association of components illustrated in the drawings. The terms may be a relative concept and described based on directions expressed in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an embodiment of a display device DD will be described with reference to the accompanying drawings.

Figure 1B:
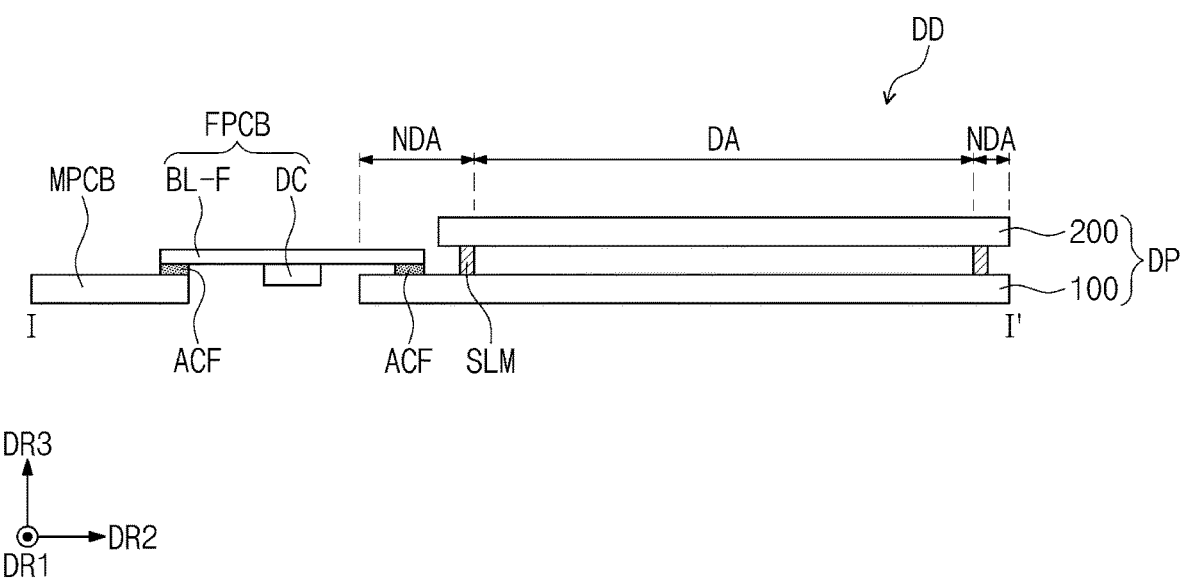
FIG. 1B is a cross-sectional view illustrating an embodiment of the display device.
Figure 2:
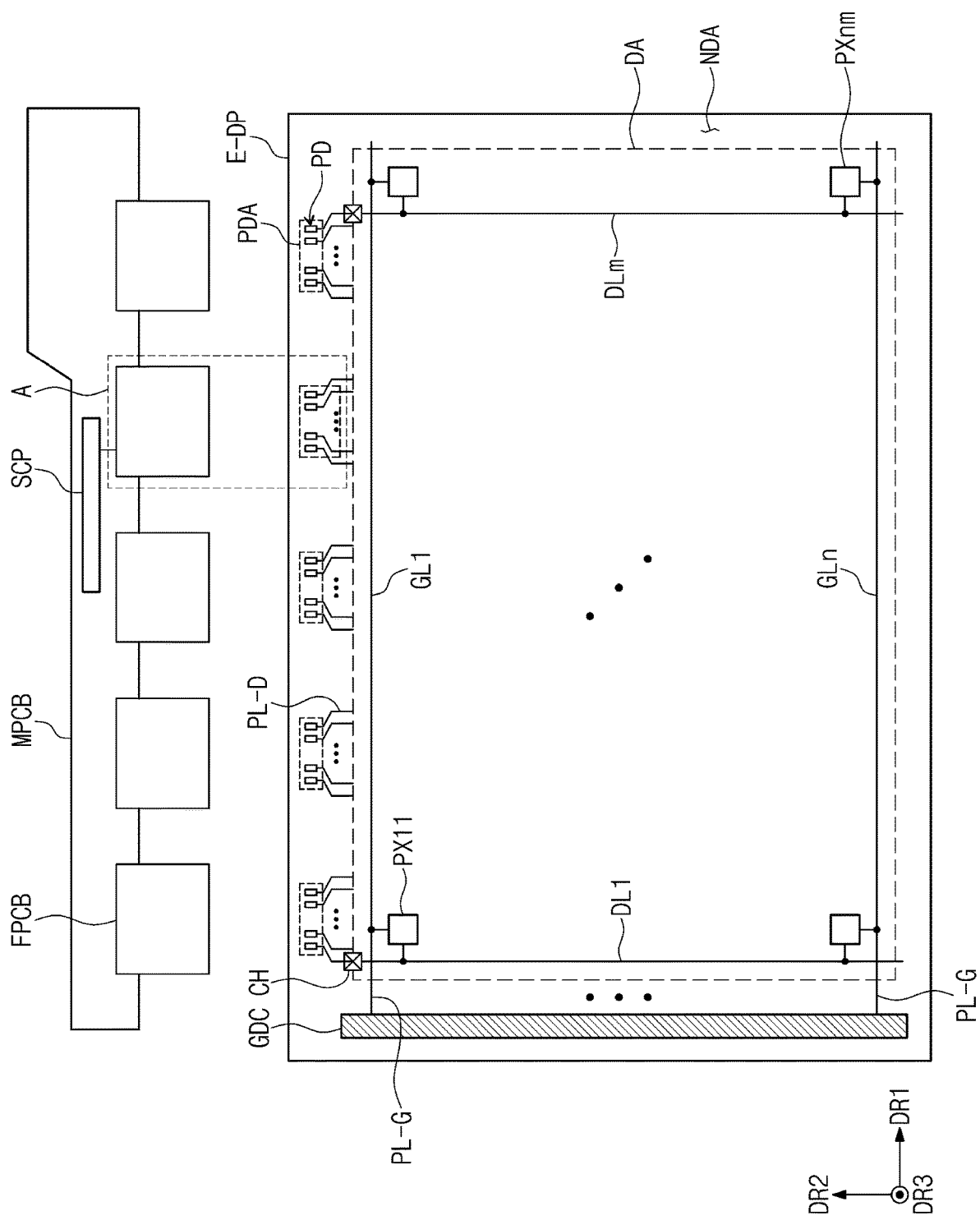
FIG. 2 is a plan view illustrating an embodiment of the display device.

FIG. 1A is a perspective view illustrating an embodiment of a display device DD. FIG. 1B is a cross-sectional view of the display device DD along line I-I' of FIG. 1A. FIG. 2 is a plan view of an embodiment of the display device DD.

Referring to FIGS. 1A, 1B, and 2, a display device DD includes a display panel DP, a connection circuit board FPCB and a main circuit board MPCB. Although a driving circuit DC is shown mounted to the connection circuit board FPCB, the invention is not limited thereto. In an embodiment, for example, the driving circuit DC may be mounted to the display panel DP or on the main circuit board MPCB instead of being mounted to the connection circuit board FPCB. The display device DD may include the connection circuit board FPCB provided in plural including a plurality of connection circuit boards FPCB, and the driving circuit DC may be mounted to each of the plurality of connection circuit boards FPCB to include a plurality of driving circuits DC.

Although not separately shown, the display device DD may further include a chassis member and/or a molding member, and may further include a backlight unit according to a light-emitting structure of the display panel DP.

The display panel DP may be one among a liquid crystal display panel, a plasma display panel, an electrophoretic display panel, a microelectromechanical system ("MEMS") display panel, an electrowetting display panel and an organic light emitting display panel. However, the invention is not limited thereto. Hereinafter, in this specification, the display panel DP will be described as the organic light emitting display panel representing a self-emissive display. In an embodiment, for example, the display panel DP may be the liquid crystal display panel representing a display for which a backlight unit is provided.

The display panel DP may include a first substrate 100 and a second substrate 200 which is spaced apart from the first substrate 100 while facing the first substrate 100. A cell cap may be defined between the first substrate 100 and the second substrate 200, along a thickness direction of the display device DD. The cell gap may be maintained by a sealant SLM that couples the first substrate 100 to the second substrate 200.

The cell cap defined between the first substrate 100 and the second substrate 200 may include an air layer. However, the invention is not limited thereto. The cell cap defined between the first substrate 100 and the second substrate 200 may be filled with a buffer layer including or made of an insulating material or the like. A gray scale display layer for generating an image may be disposed between the first substrate 100 and the second substrate 200. The gray scale display layer may include a liquid crystal layer, an organic light emitting layer or an electrophoretic layer according to a structure of the display panel DP.

Although not shown, one of the first substrate 100 and the second substrate 200 may be omitted, and the display panel DP may include only one display substrate. In an embodiment, for example, the second substrate 200 may be omitted from the display panel DP, and components within the second substrate 200 may be provided on or within the first substrate 100.

As illustrated in FIG. 1A, the display panel DP may generate and/or display an image to outside the display device DD through a display surface DP-IS. The display surface DP-IS is parallel to a plane defined by a first direction DR1 and a second direction DR2 crossing each other. The display surface DP-IS may include a display area DA and a non-display area NDA. The non-display area NDA is adjacent to the display area DA and may be defined along an edge E-DP (refer to FIG. 2) of the display surface DP-IS. The display area DA may be surrounded by the non-display area NDA, without being limited thereto. In an embodiment, the non-display area NDA may be disposed adjacent to only one side of the display area DA, such as the side which corresponds to the connection circuit board FPCB. Various components or layers of the display device DD may include a display area DA and a non-display area NDA corresponding to those described above for the display device DD.

A direction normal to the display surface DP-IS, e.g., a thickness direction of the display panel DP, is a third direction DR3. Hereinafter, a front surface (or a top surface) and a rear surface (or a bottom surface) of each of layers or units are distinguished by the third direction DR3. However, the first to third directions DR1, DR2 and DR3 in the following descriptions are merely illustrative, and the invention is not limited thereto.

Although the display panel DP having a flat display surface is illustrated, the invention is not limited thereto. The display device DD may include a curved display surface or a three-dimensional display surface. The three-dimensional display surface may include the display area DA disposed at a plurality of display regions facing different directions from each other.

A signal control part (e.g., signal controller SCP) may be mounted to the main circuit board MPCB. The signal controller SCP receives image data and control signals from an external graphic control unit (not shown), e.g., from outside of the display device DD. The signal controller SCP may generate and/or provide a control signal to the display panel DP from outside the display panel DP.

The connection circuit board FPCB may be electrically connected to each of the display panel DP and the main circuit board MPCB. The connection circuit board FPCB may transmit an electrical signal from the main circuit board MPCB to the driving circuit DC and an electrical signal from the driving circuit DC to the display panel DP. In the embodiment, the driving circuit DC may be a data driving circuit. In an embodiment, the connection circuit board FPCB may transmit an electrical signal from the signal controller SCP to the display panel DP. The connection circuit board FPCB may include a base layer BL-F (refer to FIG. 5A) including a flexible material.

The connection circuit board FPCB may be connected to each of the display panel DP and the main circuit board MPCB by a conductive adhesive member ACF. The conductive adhesive member ACF may include an anisotropic conductive film.

The display panel DP includes a pad row PD at a pad area PDA. The pad row PD includes a plurality of pads through which an electrical signal is provided to the display panel DP from outside thereof. The display panel DP may include the pad area PDA provided in plural including a plurality of pad areas PDA. The pad areas PDA may be arranged along an outer edge of the display panel DP, such as within the non-display area NDA, without being limited thereto.

In the embodiment, the connection circuit board FPCB is connected to the pad row PD of the display panel DP. Although the pad area PDA is disposed in the first substrate 100 in the embodiment, the invention is not limited thereto. In an embodiment, the pad area PDA may be disposed in the second substrate 200.

Although a same one of the connection circuit board FPCB is shown connected to each of a plurality of pad areas PDA of the display panel DP, the invention is not limited thereto. In an embodiment, for example, two different types of connection circuit boards may be respectively connected to the pad areas PDA.

FIG. 2 is a top plan view illustrating an embodiment of a planar arrangement relationship between panel signal lines GL1 to GLn, DL1 to DLm, PL-G and PL-D and pixels PX11 to PXnm. The panel signal lines GL1 to GLn, DL1 to DLm, PL-G and PL-D may include a plurality of gate lines GL1 to GLn, a plurality of data lines DL1 to DLm, and auxiliary signal lines PL-G and PL-D.

The plurality of gate lines GL1 to GLn are arranged spaced apart from each other along the second direction DR2 while extending along the first direction DR1, and the plurality of data lines DL1 to DLm cross the plurality of gate lines GL1 to GLn in an insulating manner. The plurality of gate lines GL1 to GLn and the plurality of data lines DL1 to DLm are disposed to overlap or correspond to the display area DA. The auxiliary signal lines PL-G and PL-D are disposed to overlap or correspond to the non-display area NDA and are connected to the plurality of gate lines GL1 to GLn and the plurality of data lines DL1 to DLm.

A gate auxiliary signal line PL-G is provided in plural including gate auxiliary signal lines PL-G connected to the plurality of gate lines GL1 to GLn may be disposed in a same layer as and integrated with the plurality of gate lines GL1 to GLn. As being in a same layer, elements may be respective portions of a same material layer, without being limited thereto.

In FIG. 2, although each of the plurality of gate lines GL1 to GLn and the gate auxiliary signal lines PL-G is illustrated by one length of a signal line, the plurality of gate lines GL1 to GLn and the gate auxiliary signal lines PL-G which are connected to each other, may be defined as different portions of the one length of a signal line. However, the invention is not limited thereto. In an embodiment, for example, the plurality of gate lines GL1 to GLn and the gate auxiliary signal lines PL-G which are connected to each other, may be defined to be respectively distinguished as different signal lines.

Data auxiliary signal lines PL-D connected to the data lines DL1 to DLm may be disposed in a different layer from the plurality of data lines DL1 to DLm. As being in a different layer, elements may be respective portions of different material layers along the thickness direction, without being limited thereto. Along the thickness direction, an insulation layer may be disposed between a data auxiliary signal line PL-D and a data line which area connected to each other.

The data lines DL1 to DLm may be electrically connected to the corresponding signal lines of the data auxiliary signal lines PL-D, such as through a contact hole CH. The contact hole CH passes through at least one insulation layer disposed between the data lines DL1 to DLm and the data auxiliary signal lines PL-D which are respectively connected to each other. In FIG. 2, the contact hole CH is provided in plural including two of the contact hole CH.

In an embodiment, the contact hole CH may be omitted. The data lines DL1 to DLm and the data auxiliary signal lines PL-D may be disposed in the same layer. Here, the data line and the data auxiliary line which are connected to each other among the data lines DL1 to DLm and the data auxiliary signal lines PL-D may be defined together as one signal line. Here, the data line and the data auxiliary line which are connected to each other may define different portions of the one signal line.

Each of the pixels PX11 to PXnm is connected a corresponding gate line of the plurality of gate lines GL1 to GLn and a corresponding data line of the plurality of data lines DL1 to DLm. Each of the pixels PX11 to PXnm may include a pixel driving circuit and a display element.

The pixels PX11 to PXnm may be arranged in a matrix form in both the first direction DR1 and the second direction DR2 within the display area DA. However, the invention is not limited thereto. In an embodiment, for example, the pixels PX11 to PXnm may be arranged in a pentile form. Alternatively, the pixels PX11 to PXnm may be arranged in a diamond shape or a stripe shape within the display area DA.

As illustrated in FIG. 2, a pad row PD (e.g., a row of pads) is disposed in each of the pad areas PDA. The pad row PD includes a plurality of pads (e.g., display pads PD-P (refer to FIG. 4B) arranged along the first direction DR1. The pad row PD may be disposed adjacent to an edge E-DP of the display panel DP and arranged along a length of the edge E-DP. The pads of the pad row PD are connected to the data auxiliary signal lines PL-D, respectively.

A gate driving circuit GDC may be integrated to the display panel DP such as through an oxide silicon gate driver circuit ("OSG") or amorphous silicon gate driver circuit ("ASG") process. The gate auxiliary signal lines PL-G receive a gate signal from the gate driving circuit GDC.

Figure 3:
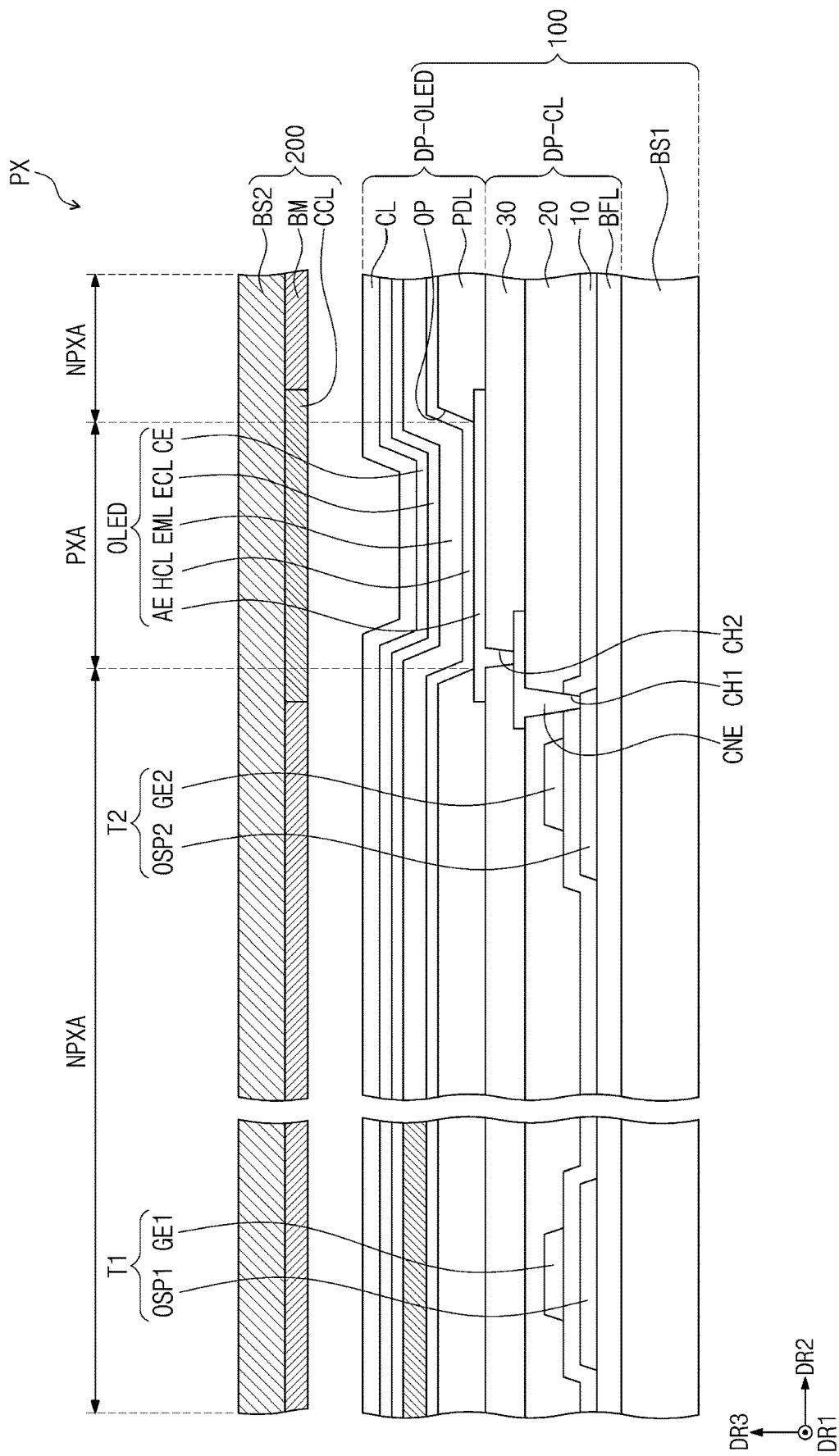
FIG. 3 is an enlarged cross-sectional view illustrating an embodiment of a display panel.

FIG. 3 is a cross-sectional view illustrating an embodiment of a pixel PX among the pixels PX11 to PXnm of the display panel DP.

As described above, the display panel DP may be the organic light emitting display panel. As illustrated in FIG. 3, the pixel PX of the display panel DP may include a switching transistor T1, a driving transistor T2 and a display element such as a light emitting device OLED.

The display panel DP may include a first substrate 100 and a second substrate 200. In the display panel DP, the first substrate 100 may be referred to as a display substrate, and the second substrate 200 may be referred to as an encapsulation substrate. The first substrate 100 may include a first base substrate BS1, a circuit device layer DP-CL disposed on the first base substrate BS1, a display device layer DP-OLED disposed on the circuit device layer DP-CL, and a cover layer CL disposed on the display device layer DP-OLED. That is, the first base substrate BS1, the circuit device layer DP-CL, the display device layer DP-OLED and the cover layer CL may be in order along the thickness direction.

The second substrate 200 may include a second base substrate BS2, a black matrix layer BM (e.g., light blocking layer) disposed on the second base substrate BS2, and a color converting layer CCL.

In an embodiment, the second substrate 200 may be omitted, and at least one of components in the second substrate 200 may be directly disposed on a layer of the first substrate 100. At least one of the second base substrate BS2 and the color converting layer CCL in the second substrate 200 may be omitted. More specifically, the second base substrate BS2 may be omitted, and the color converting layer CCL and the black matrix layer BM may be directly disposed on a layer of the first substrate 100. Although not shown, an upper buffer layer for flattening a top surface of the cover layer CL may be disposed on the cover layer CL and within the first substrate 100, and the color converting layer CCL and the black matrix layer BM may be directly disposed on the upper buffer layer.

The first base substrate BS1 may include a synthetic resin substrate or a glass substrate. The circuit device layer DP-CL includes at least one insulation layer and a circuit device. The circuit device includes a signal line, a driving circuit of the pixel PX, etc. The circuit device layer DP-CL may be provided by forming an insulation layer, a semiconductor layer and a conductive layer such as by a coating process or a deposition process, and patterning the insulation layer, the semiconductor layer and the conductive layer such as by a photolithography process.

In the embodiment, the circuit device layer DP-CL may include a buffer layer BFL, a first insulation layer 10, a second insulation layer 20 and a third insulation layer 30. Each of the first insulation layer 10 and the second insulation layer 20 may be an inorganic layer, and the third insulation layer 30 may be an organic layer. The third insulation layer 30 may be referred to as an intermediate organic layer.

In FIG. 3, an arrangement relationship between a first semiconductor pattern OSP1, a second semiconductor pattern OSP2, a first control electrode GE1 and a second control electrode GE2, which constitute a switching transistor T1 and a driving transistor T2, a connection electrode CNE and a first through-hole CH1 is also exemplarily illustrated. Although not shown, an input electrode and an output electrode may be connected to the first semiconductor pattern OSP1 and the second semiconductor pattern OSP2, which constitute the switching transistor T1 and the driving transistor T2, respectively.

The display device layer DP-OLED includes the light emitting device OLED. The display device layer DP-OLED may include an organic light emitting diode as the light emitting device OLED. The display device layer DP-OLED includes a pixel defining layer PDL. In an embodiment, for example, the pixel defining layer PDL may be an organic layer.

A first electrode AE is disposed on the third insulation layer 30. The first electrode AE is connected to the connection electrode CNE through a second through-hole CH2 passing through the third insulation layer 30. An opening OP is defined in the pixel defining layer PDL. The opening OP of the pixel defining layer PDL exposes at least a portion of the first electrode AE to outside the pixel defining layer PDL. The opening OP of the pixel defining layer PDL is referred to as a light emitting opening to be distinguished from other openings.

As illustrated in FIG. 3, the display panel DP may include a light emitting area PXA and a non-light emitting area NPXA which is adjacent to the light emitting area PXA. The non-light emitting area NPXA may surround the light emitting area PXA. In the embodiment, the light emitting area PXA may be defined in correspondence to a portion of the first electrode AE which is exposed to outside the pixel defining layer PDL by the opening OP defined therein.

A hole control layer HCL may be disposed in the light emitting area PXA and the non-light emitting area NPXA in common. The hole control layer HCL may include a hole transport layer and further include a hole injection layer. A light emitting layer EML is disposed on the hole control layer HCL. The light emitting layer EML may be disposed in the light emitting area PXA and the non-light emitting area NPXA in common. However, the invention is not limited thereto. In an embodiment, for example, the light emitting layer EML may be patterned to be disposed only in the light emitting area PXA and not in the non-light emitting area NPXA. The light emitting layer EML may include an organic material and/or an inorganic material. The light emitting layer EML may include a light emitting material generating first color light, e.g., blue light.

An electron control layer ECL is disposed on the light emitting layer EML. The electron control layer ECL may include an electron transport layer and further include an electron injection layer. The electron control layer ECL may be disposed in the light emitting area PXA and the non-light emitting area NPXA in common. The hole control layer HCL and the electron control layer ECL may be provided in the plurality of pixels PX11 to PXnm in common such as by using an open mask.

A second electrode CE is disposed on the electron control layer ECL. The second electrode CE faces the first electrode AE. The second electrode CE is disposed in the plurality of pixels PX11 to PXnm in common. The cover layer CL protecting the second electrode CE may be disposed on the second electrode CE. The cover layer CL may include an organic material or an inorganic material.

The second base substrate BS2 is spaced apart from the cover layer CL. The second base substrate BS2 may include a synthetic resin substrate or a glass substrate. The color converting layer CCL may transmit the first color light or convert the first color light into second color light or third color light, which has a wavelength different from a wavelength of the first color light, according to the pixel PX in which the color converting layer CCL is provided. In an embodiment, the second color light may be green light and the third color light may be red light. The color converting layer CCL may include a light generating body and/or a light emitting body such as a quantum dot.

In an embodiment, the second base substrate BS2 of the second substrate 200 may be omitted, and a thin-film encapsulation layer and/or an upper buffer layer may be further disposed on the display device layer DP-OLED of the first substrate 100. Here, where the second base substrate BS2 of the second substrate 200 is omitted, the black matrix layer BM and the color converting layer CCL may be directly disposed on the thin-film encapsulation layer.

Figure 4A:
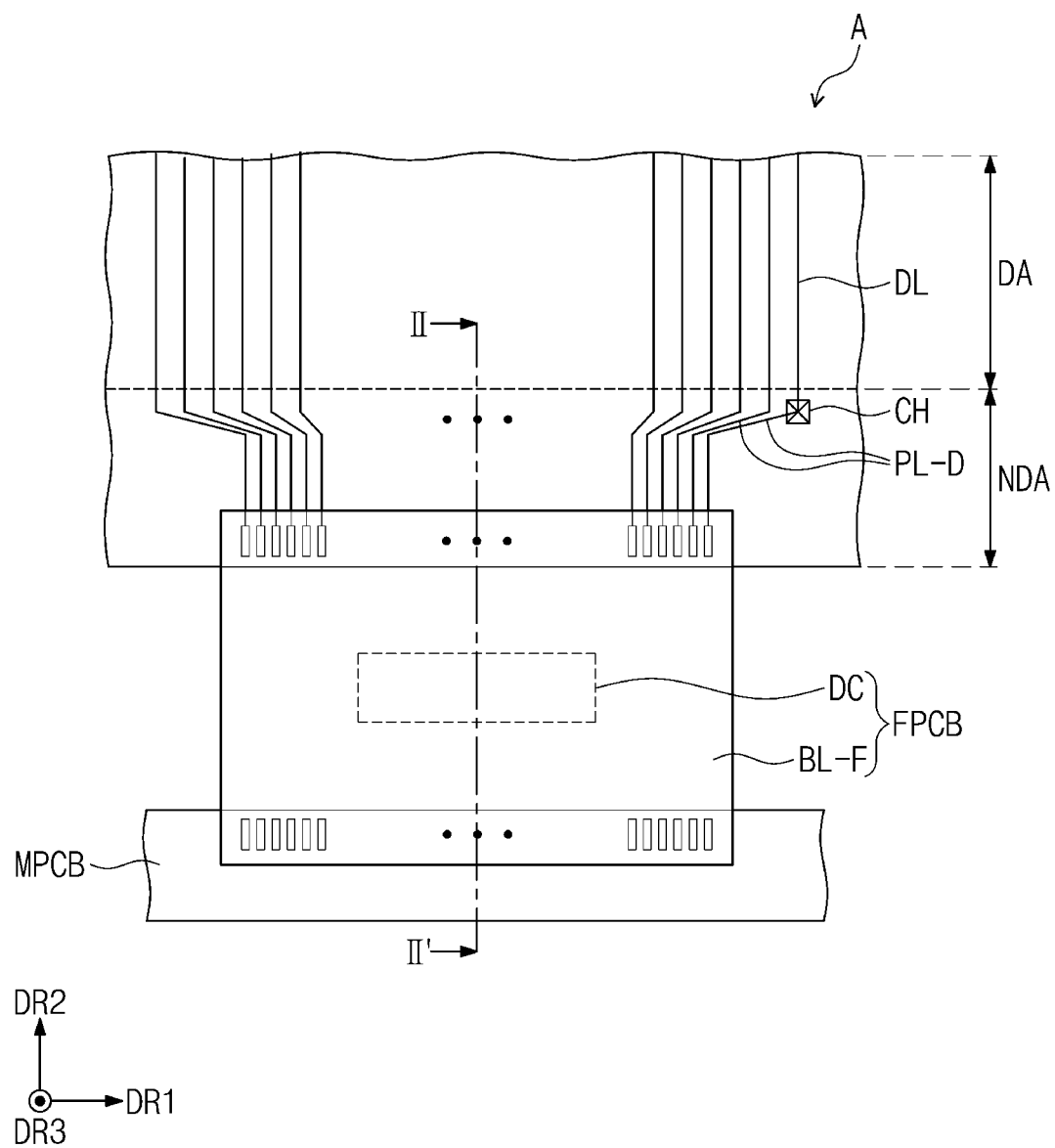
FIG. 4A is an enlarged plan view illustrating an embodiment of an end portion of the display device.
Figure 4B:
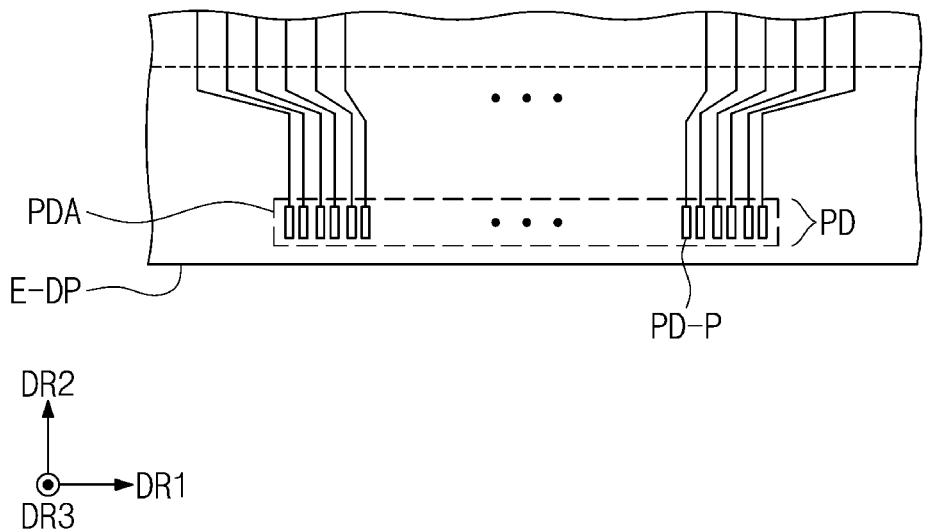
FIG. 4B is an enlarged plan view illustrating an embodiment of an end portion of the display panel.
Figure 4C:
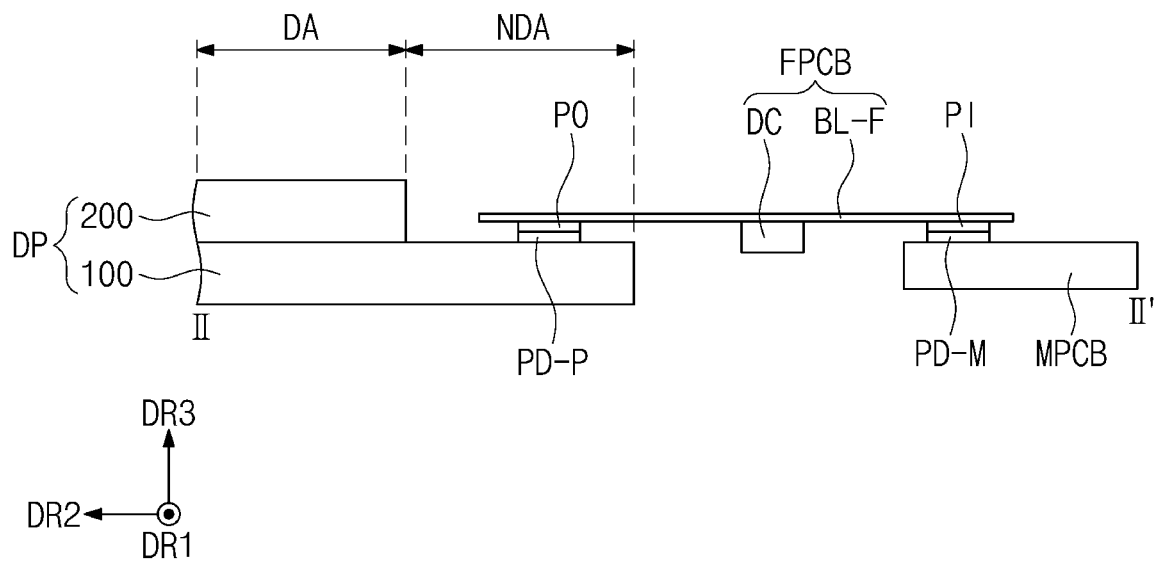
FIG. 4C is a cross-sectional view illustrating an embodiment of an end portion of the display device.

FIG. 4A is an enlarged plan view illustrating an embodiment of an end portion of the display device DD. FIG. 4B is an enlarged plan view illustrating an embodiment of an end portion of the display panel DP. FIG. 4C is a cross-sectional view illustrating an embodiment of an end portion of the display device DD.

FIG. 4A illustrates a plan view illustrating an embodiment of area A in FIG. 2 in which the display panel DP and the connection circuit board FPCB are coupled to each other. FIG. 4B is a view illustrating the pad area PDA of the display panel DP at which the display panel DP is electrically connected to the connection circuit board FPCB. FIG. 4C is a cross-sectional view taken along line II-II in FIG. 4A.

Referring to FIGS. 4A to 4C in conjunction with FIG. 1A, the pad row PD disposed in the pad area PDA of the display panel DP is electrically connected with an output pad PO of the connection circuit board FPCB. A display pad PD-P is provided in plural including a plurality of display pads PD-P may be disposed within the pad row PD disposed in the pad area PDA of the display panel DP. Respective ones of the display pad PD-P of the display panel DP and the output pad PO of the connection circuit board FPCB may be electrically connected to each other. An input pad PI of the connection circuit board FPCB may be electrically connected to a circuit pad PD-M of the main circuit board MPCB. Although not shown, a conductive adhesive member ACF (refer to FIG. 2) may be further disposed between the display pad PD-P and the output pad PO and/or between the input pad PI and the circuit pad PD-M.

Figure 5A:
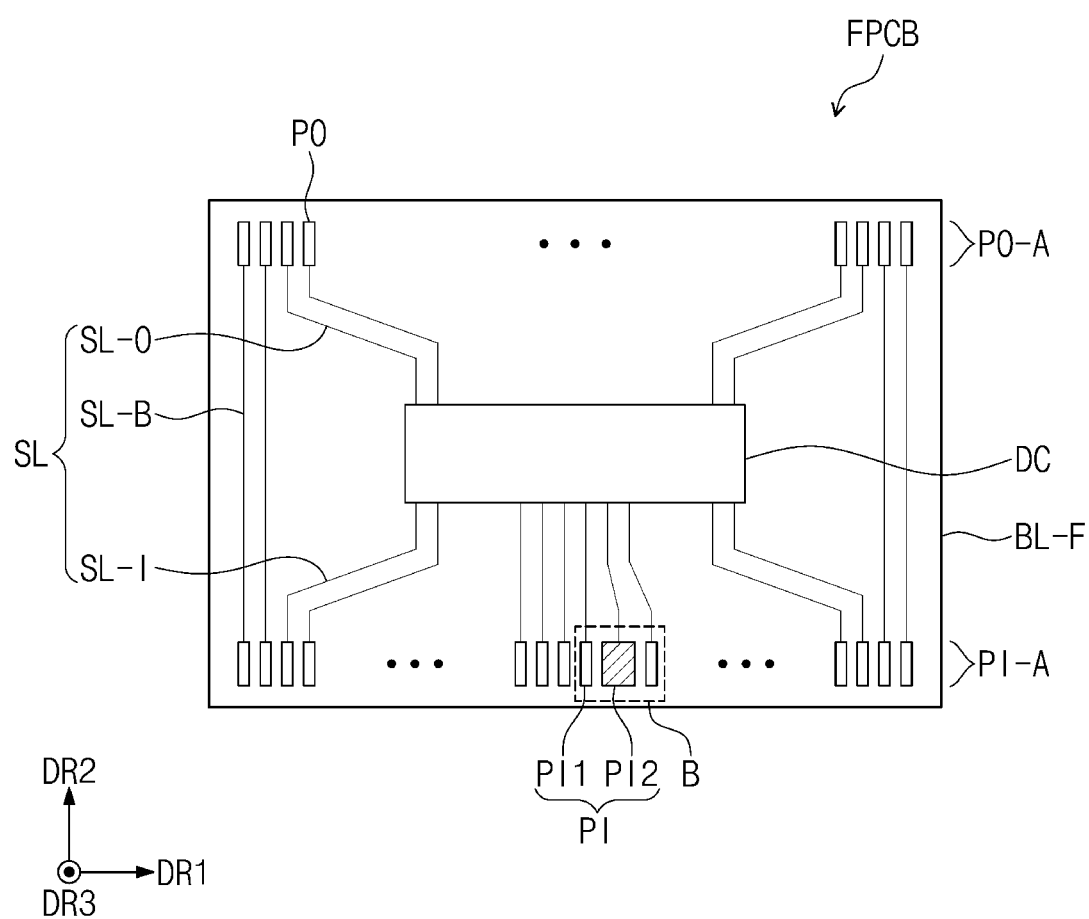
FIG. 5A is a plan view illustrating an embodiment of a connection circuit board.
Figure 5B:
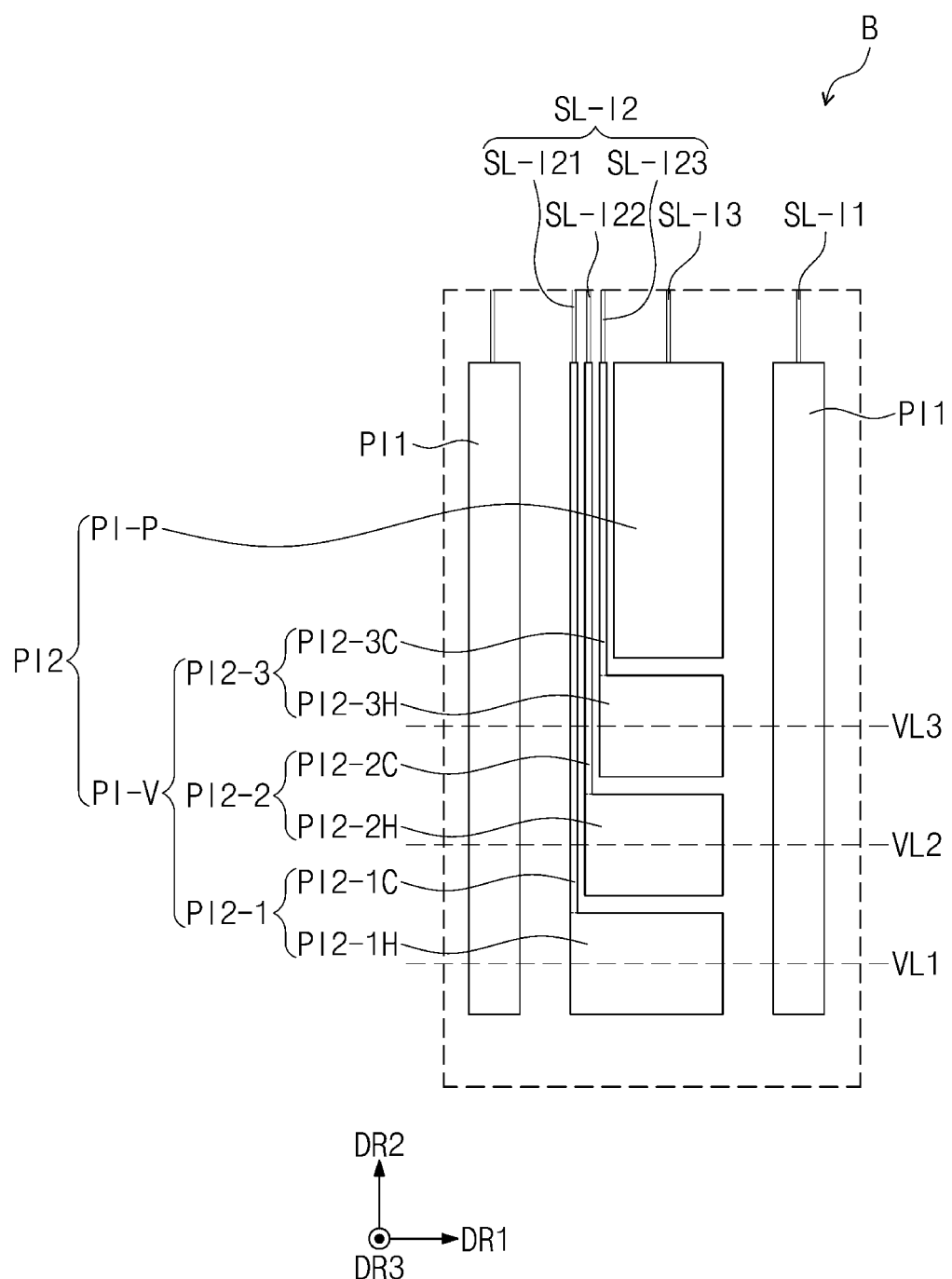
FIGS. 5B to 5D are enlarged plan views illustrating embodiments of portions of the connection circuit board.
Figure 5C:
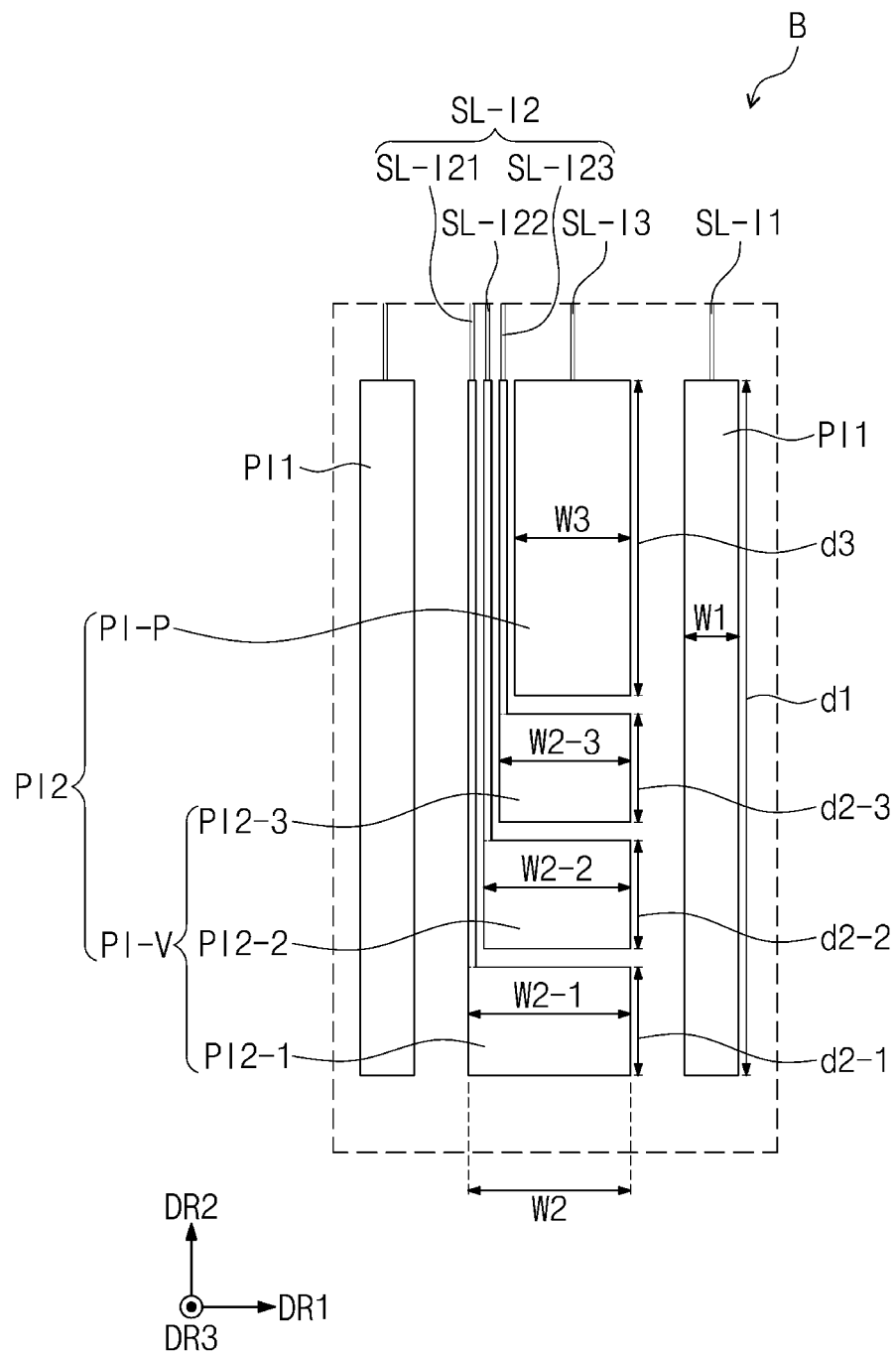
Figure 5D:
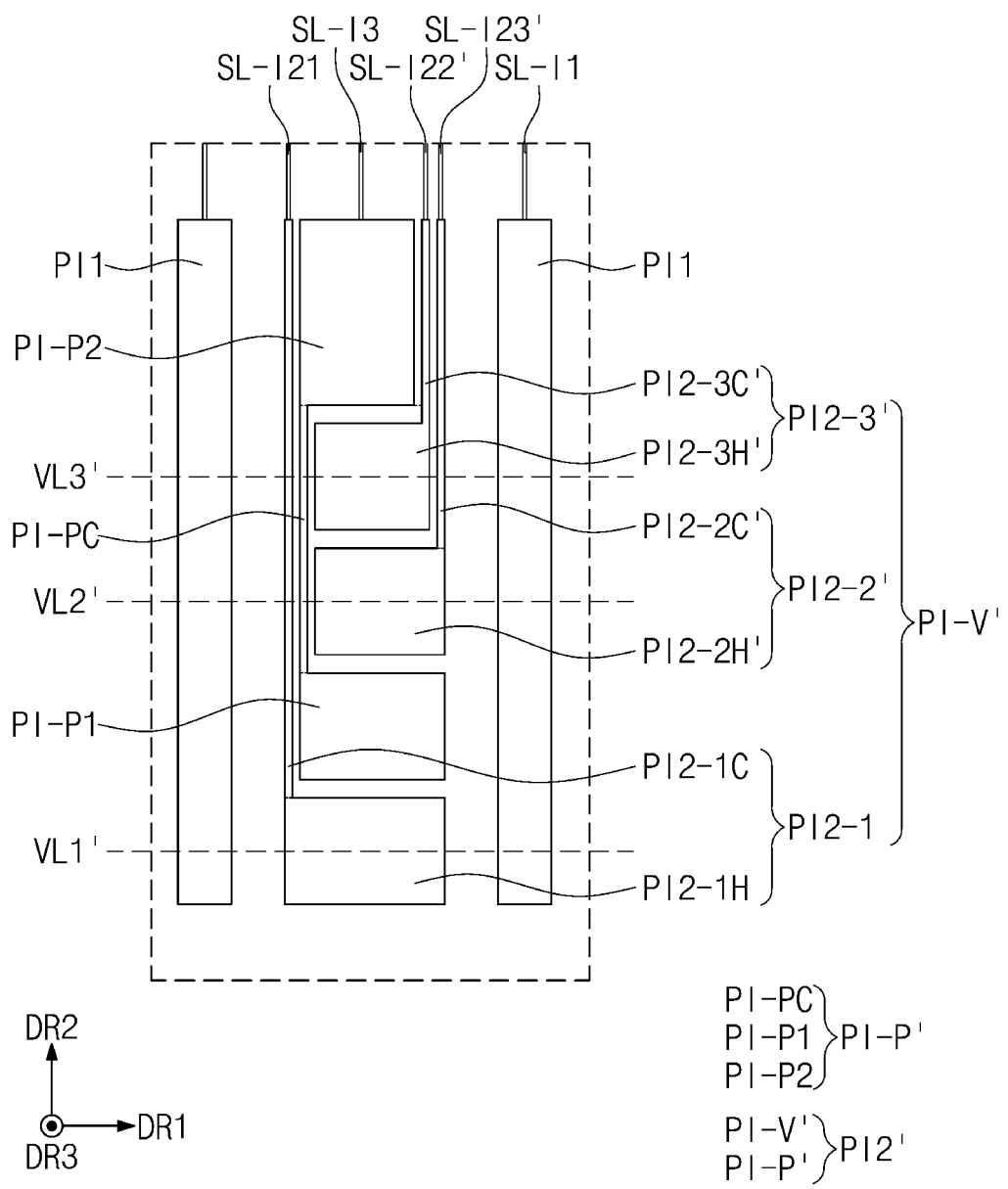

FIG. 5A is a plan view of an embodiment of the connection circuit board FPCB. FIGS. 5B to 5D are enlarged plan views illustrating embodiments of area B in FIG. 5A. FIG. 5C, dimensions of components in FIG. 5B are additionally illustrated.

Referring to FIG. 5A in conjunction with FIGS. 4A to 4C, the connection circuit board FPCB includes a base layer BL-F, and an output pad row PO-A, an input pad row PI-A, a driving circuit DC and a circuit board signal line SL, which are disposed on the base layer BL-F The base layer BL-F of the connection circuit board FPCB may include a flexible material. Also, components such as the output pad row PO-A, the input pad row PI-A, the driving circuit DC, and the circuit board signal line SL of the connection circuit board FPCB are disposed on a rear surface of the base layer BL-F. That is, the components such as the output pad row PO-A, the input pad row PI-A, the driving circuit DC and the circuit board signal line SL of the connection circuit board FPCB are disposed below the base layer BL-F along the third direction DR3. The rear surface of the base layer BL-F may be closer to the display panel DP and/or the main circuit board MPCB along a thickness direction. However, in FIG. 5A and drawings below, the components such as the output pad row PO-A, the input pad row PI-A, the driving circuit DC and the circuit board signal line SL are illustrated by a solid line in top plan views (e.g., view from a front surface which is opposite to the rear surface) for convenience of description.

The output pad row PO-A is disposed at a first side or first end of the base layer BL-F and includes the output pad PO provided in plural including a plurality of output pads PO. The plurality of output pads PO may be arranged along the first direction DR1, and each of the plurality of output pads PO may have a major dimension which extends along the second direction DR2. The plurality of output pads PO are electrically connected to the plurality of display pads PD-P disposed in the pad row PD of the display panel DP, respectively.

The input pad row PI-A is spaced apart from the first side of the base layer BL-F at which the output pad row PO-A is disposed and disposed at a second side or second end of the base layer BL-F which opposes the first side thereof. The input pad row PI-A includes the input pad PI provided in plural including a plurality of input pads PI. The plurality of input pads PI may be arranged along the first direction DR1, and each of the plurality of input pads PI may have a major dimension which extends along the second direction DR2. The plurality of input pads PI are electrically connected to the circuit pad PD-M provided in plural including a plurality of circuit pads PD-M disposed in a circuit pad row PD-MA (refer to FIG. 6A) of the main circuit board MPCB, respectively.

The plurality of input pads PI arranged within the input pad row PI-A include a first input pad PI1 and a second input pad PI2. The plurality of input pads PI may include the first input pad PI1 provided in plural including a plurality of first input pads PI1 and at least one of the second input pad PI2. The first input pad PI1 and the second input pad PI2 may be arranged within a same input pad row PI-A and overlap each other in the first direction DR1 (e.g., be aligned with each other along the first direction DR1).

In the plan view, the first input pad PI1 and the second input pad PI2 may have a major dimension (e.g., length) and a minor dimension (e.g., width). The first input pad PI1 and the second input pad PI2 may have widths taken along the first direction DR1 and the widths may be different from each other. Hereinafter, description on the plurality of input pads PI will be described later in FIGS. 5B to 5D.

The connection circuit board FPCB may include a mounting portion (e.g., mounting area) at which the driving circuit DC is mounted on the connection circuit board FPCB. The mounting area may correspond to a planar area of the driving circuit DC and be located at a central portion of the connection circuit board FPCB without being limited thereto. The driving circuit DC may be a data driving circuit. The driving circuit DC of the connection circuit board FPCB may receive an electrical signal from the main circuit board MPCB and transmit an electrical signal to the display panel DP. In an embodiment, the connection circuit board FPCB may receive an electrical signal from the display panel DP and transmit an electrical signal to the main circuit board MPCB. Although not shown, the driving circuit DC may be mounted to the main circuit board MPCB or the display panel DP instead of to the connection circuit board FPCB.

The connection circuit board FPCB may include a plurality of circuit board signal lines SL, and each of the plurality of circuit board signal lines SL may be connected to at least one of the output pad PO, the input pad PI and the driving circuit DC. The plurality of circuit board signal lines SL may include a bypass signal line SL-B that directly connects the output pad PO and the input pad PI to each other.

Also, the plurality of circuit board signal lines SL may include a primary signal line that connects the output pad PO and the input pad PI respectively to the driving circuit DC such as through a connection pad. The primary signal line may include an output signal line SL-O directly connecting the output pad PO and the driving circuit DC to each other and an input signal line SL-I directly connecting the input pad PI and the driving circuit DC to each other.

Referring to FIGS. 5A to 5C, each of the plurality of input pads PI of the connection circuit board FPCB include a first input pad PI1 and a second input pad PI2. The first input pad PI1 and the second input pad PI2 may be arranged adjacent to each other within a same input pad row PI-A and overlap each other (e.g., be aligned with each other) along the first direction DR1. The second input pad PI2 includes a pad group including a plurality of vertical arrangement pads PIV and a power pad PI-P. A plurality of vertically arranged signal pads may include a group of pads including the vertical arrangement pads PI-V and the power pad PI-P. The vertically arranged signal pads may define a pad column.

The plurality of vertical arrangement pads PI-V are arranged along the second direction DR2. The plurality of vertical arrangement pads PI-V may be arranged along the second direction DR2 within a same one of the input pad row PI-A in which the plurality of input pads PI are arranged. In an embodiment, the plurality of vertical arrangement pads PI-V includes two or more signal pads which are arranged along the second direction DR2.

Referring to FIG. 5B, for example, the plurality of vertical arrangement pads PI-V may include a first vertical arrangement pad PI2-1 (e.g., first signal pad), a second vertical arrangement pad PI2-2 (e.g., second signal pad) and a third vertical arrangement pad PI2-3 (e.g., third signal pad) which are arranged in order along the second direction DR2. The first vertical arrangement pad PI2-1, the second vertical arrangement pad PI2-2 and the third vertical arrangement pad PI2-3 may be arranged in order along the second direction DR2 from the outer edge or end of the base layer BL-F. The plurality of vertical arrangement pads PI-V may be inspection pads with which the connection circuit board FPCB is inspected for defects.

Each of the plurality of vertical arrangement pads PI-V, that is, each of the first vertical arrangement pad PI2-1, the second vertical arrangement pad PI2-2 and the third vertical arrangement pad PI2-3, and the power pad PI-P, may include a connection part (e.g., connection portion) and a pad part (e.g., pad portion). Each of the connection part and the pad part may include a major dimension (e.g., length) and a minor dimension (e.g., width). The major dimension of the connection part (e.g., first connection portion)may extend along the second direction DR2 and be connected to second input signal lines SL-I2, respectively. The pad part may be a portion that substantially performs a function of a contact pad for electrical connection to another element. The pad part extends from the connection part along the first direction DR1.

The first vertical arrangement pad PI2-1 may include a first connection part PI2-1C extending along the second direction DR2 and a first pad part PI2-1H (e.g., first pad portion) extending along the first direction DR1 from the first connection part PI2-1C, the second vertical arrangement pad PI2-2 may include a second connection part PI2-2C extending along the second direction DR2 and a second pad part PI2-2H (e.g., second pad portion) extending along the first direction DR1 from the second connection part PI2-2C, and the third vertical arrangement pad PI2-3 may include a third connection part PI2-3C extending along the second direction DR2 and a third pad part PI2-3H (e.g., third pad portion) extending along the first direction DR1 from the third connection part PI2-3C.

Although FIG. 5B shows the connection parts PI2-1C, PI2-2C and PI2-3C disposed at left sides of the pad parts PI2-1H, PI2-2H and PI2-3H, respectively, within the plurality of vertical arrangement pads PI-V, the invention is not limited thereto. In an embodiment, for example, the connection parts PI2-1C, PI2-2C and PI2-3C may be disposed at right sides of the pad parts PI2-1H, PI2-2H and PI2-3H, respectively, or a portion of the connection parts PI2-1C, PI2-2C and PI2-3C may be disposed at the left sides of the pad parts PI2-1H, PI2-2H and PI2-3H, and a remaining portion may be disposed at the right sides of the pad parts PI2-1H, PI2-2H and PI2-3H.

The connection circuit board FPCB may include a virtual line along which elements are aligned in the plan view. The first pad part PI2-1H of the first vertical arrangement pad PI2-1 may be disposed on a first virtual line VL1 extending along the first direction DR1. The second pad part PI2-2H of the second vertical arrangement pad PI2-2 may be disposed on a second virtual line VL2 extending along the first direction DR1. The third pad part PI2-3H of the third vertical arrangement pad PI2-3 may be disposed on a third virtual line VL3 extending along the first direction DR1.

The second virtual line VL2 may be defined further from an outer edge (e.g., distal end) of the connection circuit board FPCB than the first virtual line VL1. That is, the connection circuit board FPCB and the main circuit board MPCB which are connected to each other disposes the second virtual line VL2 spaced further apart from the main circuit board MPCB than the first virtual line VL1. The second virtual line VL2 may be defined closer to a mounting area at which the driving circuit DC is mounted to the connection circuit board FPCB than the first virtual line VL1. The second virtual line VL2 may be defined closer to the input signal line SL-I connected with the input pads PI and the driving circuit DC of the connection circuit board FPCB than the first virtual line VL1.

The third virtual line VL3 may be defined further from a distal end of the connection circuit board FPCB than the second virtual line VL2. That is, the connection circuit board FPCB and the main circuit board MPCB which are connected to each other disposes the third virtual line VL3 spaced further apart from the main circuit board MPCB than the second virtual line VL2. The third virtual line VL3 may be defined closer to the mounting area at which the driving circuit DC is mounted to the connection circuit board FPCB than the second virtual line VL2 and the first virtual line VL1. The third virtual line VL3 may be defined closer to the input signal line SL-I connected with the input pads PI and the driving circuit DC of the connection circuit board FPCB than the second virtual line VL2 and the first virtual line VL1.

Each of the plurality of first input pad PH may overlap or be aligned with the first virtual line VL1, the second virtual line VL2 and the third virtual line VL3. The first pad part PI2-1H of the first vertical arrangement pad PI2-1 may overlap the first virtual line VL1 and may not overlap the second virtual line VL2 and the third virtual line VL3. The second pad part PI2-2H of the second vertical arrangement pad PI2-2 may overlap the second virtual line VL2 and may not overlap the first virtual line VL1 and the third virtual line VL3. The third pad part PI2-3H of the third vertical arrangement pad PI2-3 may overlap the third virtual line VL3 and may not overlap the first virtual line VL1 and the second virtual line VL2.

In the second input pad PI2, the power pad PI-P is disposed adjacent along the second direction DR2 to the plurality of vertical arrangement pad PI-V. A power voltage as an electrical signal may be supplied to the power pad PI-P. The power pad PI-P may be disposed adjacent to a pad part among the plurality of vertical arrangement pads PI-V, e.g., the third vertical arrangement pad PI2-3 which is disposed closest to the mounting area at which the driving circuit DC is mounted. The power pad PI-P may be aligned along the second direction DR2 with the pad parts PI2-1H, PI2-2H and PI2-3H of the plurality of vertical arrangement pads PI-V. The power pad PI-P may overlap or be aligned along the second direction DR2 with at least a portion of the pad parts PI2-1H, PI2-2H and PI2-3H among the plurality of vertical arrangement pads PI-V.

The power pad PI-P may not overlap (e.g., be spaced apart from) the first virtual line VL1, the second virtual line VL2 and the third virtual line VL3. That is, the power pad PI-P may not overlap (e.g., be spaced apart from) the first pad part PI2-1H, the second pad part PI2-2H and the third pad part PI2-3H along the first direction DR1.

The input signal line SL-I may be respectively connected to the plurality of input pads PI. A first input signal line SL-I1 may be respectively connected to the plurality of first input pads PI1. A second input signal line SL-I2 may be respectively connected to the plurality of vertical arrangement pads PI-V within a same one of the second input pad PI2. The second input signal line SL-I2 may be further connected to the power pad PI-P within a same one of the second input pad PI2 including the plurality of vertical arrangement pads PI-V.

Referring again to FIG. 5B, the second input signal line SL-I2 may be connected to the connection parts PI2-1C, PI2-2C and PI2-3C of the plurality of vertical arrangement pads PI-V. One of the second input signal line SL-I2 may include a plurality of sub-input signal lines. Within a same one of the second input signal line SL-I2, a first sub-input signal line SL-I21 may be connected to the first connection part PI2-1C of the first vertical arrangement pad PI2-1, a second sub-input signal line SL-I22 may be connected to the second connection part PI2-2C of the second vertical arrangement pad PI2-2, and a third sub-input signal line SL-I23 may be connected to the third connection part PI2-3C of the third vertical arrangement pad PI2-3. Within the same one of the second input signal line SL-I2, a fourth sub-input signal line SL-I3 may be connected to the power pad PI-P. The fourth sub-input signal line SL-I3 may be considered a line separate from the second input signal line SL-I2 and may defined a third input signal line.

Referring to FIGS. 5B and 5C, an entire length of the second input pad PI2 along the second direction DR2 may be substantially the same as an entire length of the first input pad PI1 along the second direction DR2. In this specification, a feature of "substantially the same as" may include a feature in which a distance between components or dimensions of components are completely same and a feature of being same in a range including a difference that is capable of being generated by a process error although designed to be same as each other. An entire length of the first vertical arrangement pad PI2-1 which has a largest major dimension along the second direction DR2 among the plurality of vertical arrangement pads PI-V in the second input pad PI2 may be substantially the same as an entire length of the first input pad PI1 along the second direction DR2.

A total length including lengths of each of the plurality of vertical arrangement pads PI-V along the second direction DR2 may be equal to or less than a total length along the second direction DR2 of each of the plurality of first input pads PI1. A total length including lengths of each of the pad parts PI2-1H, PI2-2H and PI2-3H in the plurality of vertical arrangement pads PI-V in the second direction DR2 may be less than a total length of each of the plurality of first input pads PI1 along the second direction DR2.

Referring to FIG. 5C, each of the first input pads PI1 may have a first length d1 along the second direction DR2, each of the pad parts may have a second length, the first pad part PI2-1H may have a second-first length d2-1 (e.g., second length) along the second direction DR2, the second pad part PI2-2H may have a second-second length d2-2 along the second direction DR2, and the third pad part PI2-3H may have a second-third length d2-3 along the second direction DR2. Here, each of the second-first length d2-1, the second-second length d2-2 and the second-third length d2-3 may be less than the first length d1.

A third length d3 of the power pad PI-P along the second direction DR2 may be less than lengths of each of the plurality of first input pads PI1 along the second direction DR2. The power pad PI-P may have the third length d3 along the second direction DR2 which may be less than the first length d1.

Along the second direction DR2, a gap may be defined between adjacent pad parts among the pad parts PI2-1H, PI2-2H and PI2-3H within the plurality of vertical arrangement pads PI-V, and a gap may be defined between the power pad PI-P and the third pad part PI2-3H of the third vertical arrangement pad PI2-3 which is closest to the power pad PI-P among the plurality of vertical arrangement pads PI-V. Thus, a sum of the second-first length d2-1, the second-second length d2-2, the second-third length d2-3 and the third length d3 may be less than the first length d1, since the sum includes solid portions of the adjacent pad parts and excludes the gaps respectively therebetween.

A width of the second input pad PI2 along the first direction DR1 may be greater than that of each of the plurality of first input pads PI1 along the first direction DR1. A width of each of the pad parts PI2-1H, PI2-2H and PI2-3H in the plurality of vertical arrangement pads PI-V of the second input pad PI2 along the first direction DR1 may be greater than widths of each of the plurality of first input pads PI1 along the first direction DR1. Each of the first input pads PI1 may have a first width W1 along the first direction DR1, the first pad part PI2-1H may have a second-first width W2-1 along the first direction DR1, the second pad part PI2-2H may have a second-second width W2-2 along the first direction DR1, and the third pad part PI2-3H may have a second-third width W2-3 along the first direction DR1. Here, each of the second-first width W2-1, the second-second width W2-2 and the second-third width W2-3 may be greater than the first width W1. A second width W2 of the second input pad PI2 along the first direction DR1 may be a maximum width or total width of the second input pad PI2 and may be substantially the same as the second-first width W2-1 of the first pad part PI2-1H among the first vertical arrangement pad PI2-1. The first pad part PI2-1H may have the largest width among the plurality of vertical arrangement pads PI-V in the second input pad PI2 and may define the maximum width thereof.

A third width W3 of the power pad PI-P along the first direction DR1 may be greater than widths of each of the plurality of first input pads PI1 along the first direction DR1. The power pad PI-P may have the third width W3 along the first direction DR1, and the third width W3 may be greater than the first width W1 as a total width of the first input pad PI1. Since the power pad PI-P has the third length d3 less than the first length d1 as an extension length (e.g., major dimension) of the first input pad PI1 along the second direction DR2 but has the third width W3 greater than the first width W1 that is the maximum width of the first input pad PI1 along the first direction DR1, the power pad PI-P may have a planar area equal to or greater than that of the first input pad PI1. That is, the power pad PI-P may have a planar area equal to or greater than that of the first input pad PI1.

In the display device DD, the plurality of input pads PI of the connection circuit board FPCB which are connected to the main circuit board MPCB, include the plurality of first input pads PI1 defining the input pad row PI-A and the second input pad PI2 having the maximum width greater than that of the first input pad PI1 along the first direction DR1 that is a direction of the input pad row PI-A. Also, the second input pad PI2 includes the plurality of vertical arrangement pads PI-V and the power pad PI-P which is disposed adjacent to the plurality of vertical arrangement pads PI-V along the second direction DR2 that is an extension direction (e.g., major dimension direction) of the second input pad PI2. As the second input pad PI2 includes the power pad PI-P and the plurality of vertical arrangement pads PI-V which function as the inspection pad, the number of pads disposed on the input pad row PI-A of the connection circuit board FPCB along a row direction may be reduced to increase the gap between the pads disposed within the input pad row PI-A and thus reduce or effectively prevent a limitation such as short-circuit between the pads. Also, although the third length d3 of the power pad PI-P along the second direction DR2 is less than the first length d1 of the first input pad PI1 since the power pad PI-P is aligned with the plurality of vertical arrangement pads PI-V, as the third width W3 of the power pad PI-P along the first direction DR1 is greater than the first width W1 of the first input pad PI1, the planar area of the power pad PI-P may be secured to be equal to or greater than that of the first input pad PI1. Thus, a connection characteristic of the power pad PI-P may be secured. With the connection characteristic of the power pad PI-P secured, the display device DD including the connection circuit board FPCB connected to the display panel DP may have improved reliability.

Referring to FIG. 5D, a second input pad PI2' may include a plurality of vertical arrangement pads PI-V' and a power pad PI-V. Among connection parts within a same one of the plurality of vertical arrangement pads PI-V', a portion of connection parts may be disposed at a same side (e.g., a left side of a respective pad part), and a remaining portion may be disposed at a different same side (e.g., a right side of the respective pad part). In an embodiment, for example, a first connection part PI2-1C of a first vertical arrangement pad PI2-1 may be disposed extended from a first pad part PI2-1H at a left side of the first pad part PI2-1H, a second connection part PI2-2C' of a second vertical arrangement pad PI2-T may be disposed extended from a second pad part PI2-2H' at a right side of the second pad part PI2-2H', and a third connection part PI2-3C' of a third vertical arrangement pad PI2-3' may be disposed extended from a third pad part PI2-3H' at the right side of the third pad part PI2-3H' (e.g., a same side at which the second connection part PI2-2C' extends from the second pad part PI2-2H').

Along the second direction DR2, the first pad part PI2-1H of the first vertical arrangement pad PI2-1 may be disposed on a first virtual line VL1', the second pad part PI2-2H' of the second vertical arrangement pad PI2-2' may be disposed on a second virtual line VL2', and the third pad part PI2-3H' of the third vertical arrangement pad PI2-3' may be disposed on a third virtual line VL3'.

The power pad PI-P' in the second input pad PI2' may include a first portion PI-P1 (e.g., fourth pad portion), a second portion PI-P2 (e.g., fifth pad portion) and a second connection portion PI-PC. The first portion PI-P1 and the second portion PI-P2 may be spaced apart from each other along the second direction DR2. The first portion PI-P1 and the second portion PI-P2 may be connected to each other by the second connection portion PI-PC which extends along the second direction DR2. At least one of the plurality of vertical arrangement pads PI-V' may be disposed between the first portion PI-P1 and the second portion PI-P2 along the second direction DR2. At least one of the first vertical arrangement pad PI2-1, the second vertical arrangement pad PI2-2' and the third vertical arrangement pad PI2-3' may be disposed between the first portion PI-P1 and the second portion PI-P2 which are spaced apart from each other along the second direction DR2. More specifically, at least one pad part among the first vertical arrangement pad PI2-1, the second vertical arrangement pad PI2-2' and the third vertical arrangement pad PI2-3' may be disposed between the first portion PI-P1 and the second portion PI-P2.

Although the second pad part PI2-2H' of the second vertical arrangement pad PI2-T and the third pad part PI2-3H' of the third vertical arrangement pad PI2-3' are disposed between the first portion PI-P1 and the second portion PI-P2 of the power pad PI-P' in FIG. the invention is not limited thereto. In an embodiment, for example, only one among the second pad part PI2-2H' of the second vertical arrangement pad PI2-2' and the third pad part PI2-3H' of the third vertical arrangement pad PI2-3' may be disposed between the first portion PI-P1 and the second portion PI-P2. Alternatively, the first pad part PI2-1H of the first vertical arrangement pad PI2-1 may be disposed between the first portion PI-P1 and the second portion PI-P2.

Referring again to FIG. 5D, the first portion PI-P1 may be disposed between the first pad part PI2-1H of the first vertical arrangement pad PI2-1 and the second pad part PI2-2H' of the second vertical arrangement pad PI2-2'. As the first portion PI-P1 is disposed between the first pad part PI2-1H of the first vertical arrangement pad PI2-1 and the second pad part PI2-2H' of the second vertical arrangement pad PI2-2', the first portion PI-P1 may be disposed between the first virtual line VL1' and the second virtual line VL2'. That is, the first portion PI-P1 may be spaced apart from each of the first virtual line VL1' and the second virtual line VL2'.

Figure 6A:
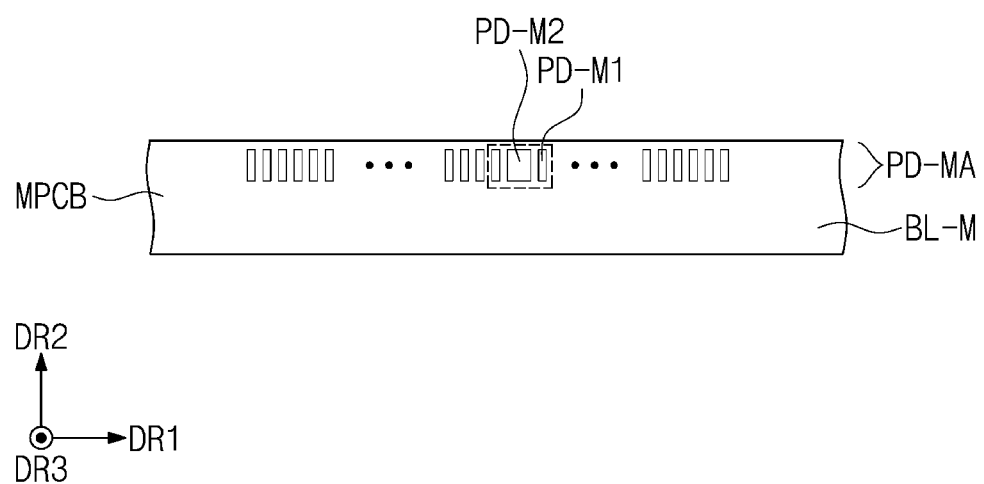
FIG. 6A is a plan view illustrating an embodiment of a portion of a main circuit board.
Figure 6B:
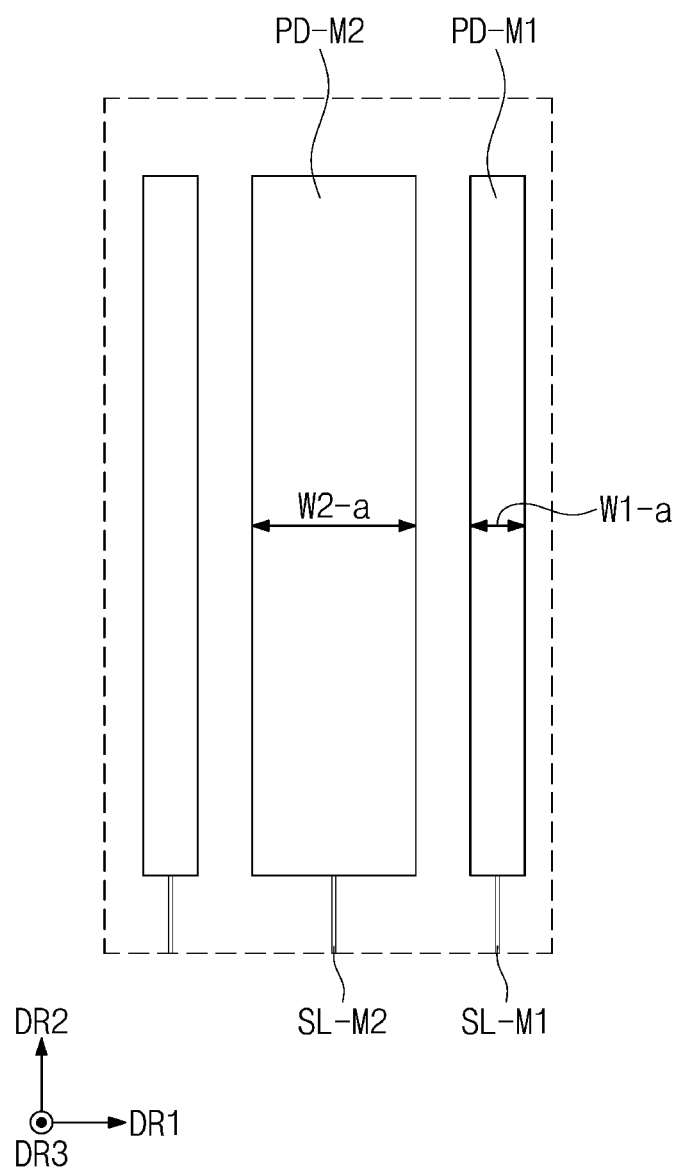
FIG. 6B is an enlarged plan view illustrating an embodiment of a portion of the main circuit board.
Figure 7A:
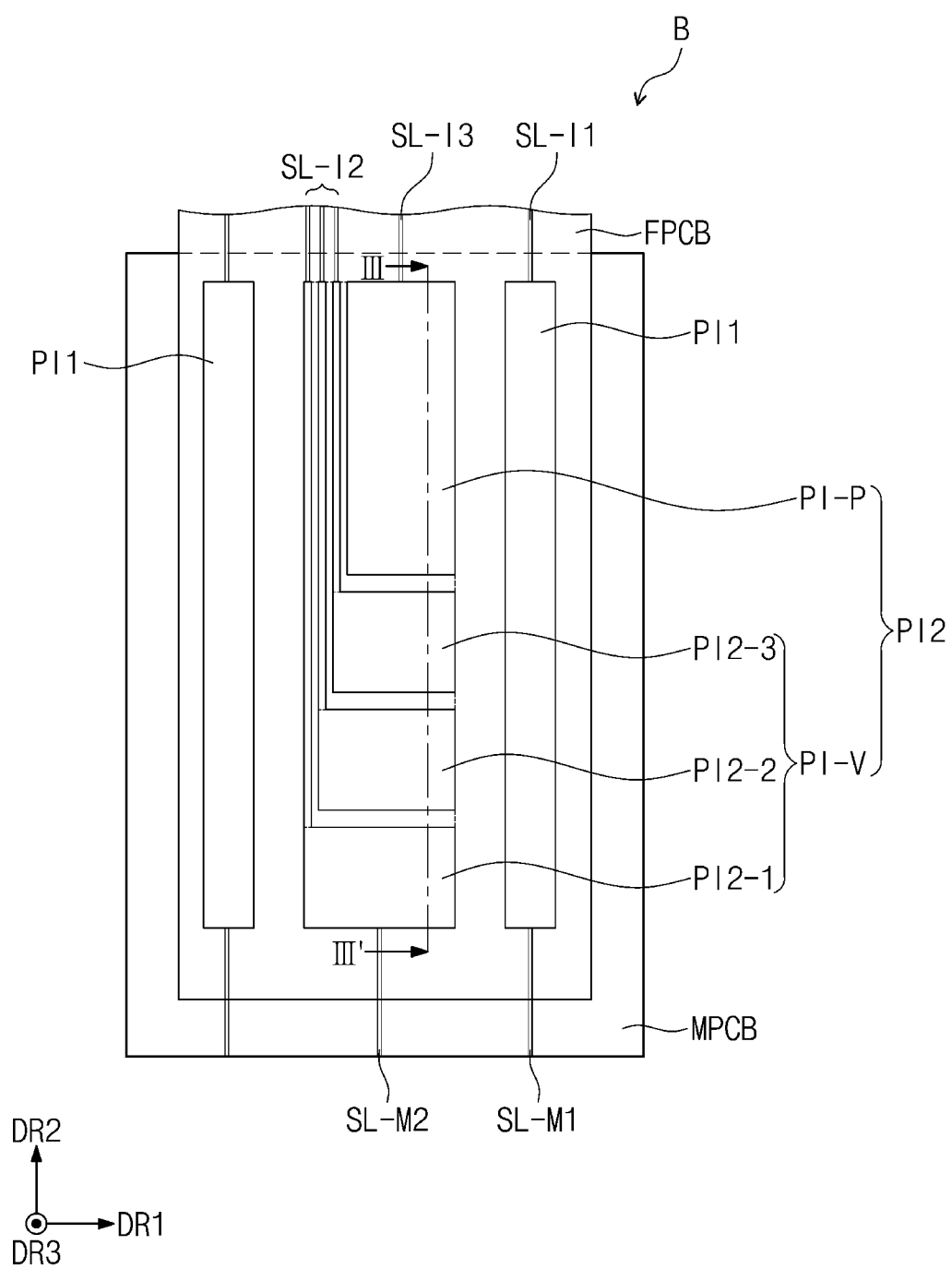
FIG. 7A is a plan view illustrating an embodiment of an area at which the main circuit board and the connection circuit board are connected to each other.
Figure 7B:
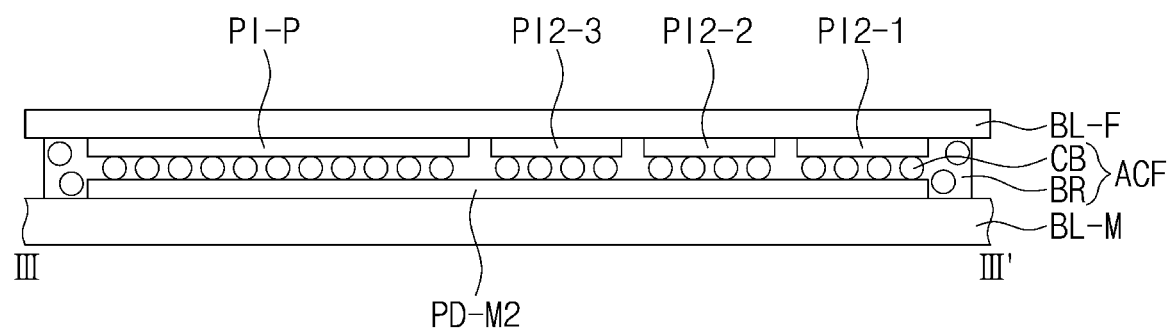
FIG. 7B is a cross-sectional view illustrating the area at which the main circuit board and the connection circuit board are connected to each other.

FIG. 6A is a plan view illustrating an embodiment of a portion of the main circuit board MPCB. FIG. 6B is an enlarged plan view illustrating an embodiment of an area of the main circuit board MPCB which is indicated by a dotted line box in FIG. 6A. FIG. 7A is a plan view illustrating an embodiment of a connection area at which the main circuit board MPCB and the connection circuit board FPCB are electrically connected to each other. FIG. 7B is a cross-sectional view illustrating an embodiment of the connection area at which the main circuit board MPCB and the connection circuit board FPCB are electrically connected to each other.

FIG. 6A illustrates a circuit pad row PD-MA of the main circuit board MPCB which is electrically connected to the connection circuit board FPCB. FIG. 6B is an enlarged plan view of a portion of the circuit pad row PD-MA in FIG. 6A. FIG. 7A illustrates a planar area of the main circuit board MPCB relative to a planar area of a portion of the connection circuit board FPCB which corresponds to the region in FIG. 5B. FIG. 7B illustrates a cross-section taken along line III-III' in FIG. 7A.

Referring to FIGS. 6A and 6B in conjunction with FIGS. 4A to 4C, the main circuit board MPCB may include a board base layer BL-M and a circuit pad row PD-MA which is disposed on the board base layer BL-M. A plurality of circuit pads PD-M may be arranged within the circuit pad row PD-MA. The plurality of circuit pads PD-M may include a first circuit pad PD-M1 which is provided in plural including a plurality of first circuit pads, and a second circuit pad PD-M2. In the plan view, the first circuit pad PD-M1 and the second circuit pad PD-M2 may have a major dimension (e.g., length) and a minor dimension (e.g., width).

The first circuit pad PD-M1 and the second circuit pad PD-M2 may have the substantially same length as each other along the second direction DR2. The second circuit pad PD-M2 may have a width greater than that of the first circuit pad PD-M1 along the first direction DR1. In an embodiment, the second circuit pad PD-M2 may have a second circuit width W2-*a* along the first direction DR1, and the first circuit pad PD-M1 may have a first circuit width W1-*a* along the first direction DR1. Here, the second circuit width W2-*a* may be greater than the first circuit width W1-*a*.

A plurality of circuit lines SL-M1 and SL-M2 may be respectively connected to the plurality of circuit pads PD-M. A first circuit line SL-M1 may be connected to each of the plurality of first circuit pads PD-M1, and a second circuit line SL-M2 may be connected to the second circuit pad PD-M2. The plurality of circuit pads PD-M may be connected to a signal controller SCP mounted to the main circuit board MPCB by the plurality of circuit lines SL-M1 and SL-M2 (e.g., FIG. 2 shows a connection line between a connection circuit board FPCB at area A and the signal controller SCP).

Referring to FIGS. 7A and 7B in conjunction with FIGS. 4A to 4C, the connection circuit board FPCB and the main circuit board MPCB may be attached to each other by an conductive adhesive member ACF. The input pad PI of the connection circuit board FPCB and the circuit pad PD-M of the main circuit board MPCB may be electrically connected to each other by a conductive element such as a conductive ball CB provided in plural including conductive balls CB distributed on a base resin BR of the conductive adhesive member ACF.

The first circuit pad PD-M1 among the plurality of circuit pads PD-M may be electrically connected to the first input pad PH among the plurality of input pads PI. Each of a plurality of first circuit pads PD-M1 may be electrically connected to a corresponding one of the first input pad PH among a plurality of first input pads PH (e.g., one-to-one correspondence). A width of the of first circuit pad PD-M1 along the first direction DR1 may be substantially the same as that of the first input pad PH along the first direction DR1, and a length of the of first circuit pad PD-M1 along the second direction DR2 may be substantially the same as that of the first input pad PH along the second direction DR2.

The second circuit pad PD-M2 among the plurality of circuit pads PD-M may be electrically connected to the second input pad PI2 among the plurality of input pads PI. The second circuit pad PD-M2 may be electrically connected to the power pad PI-P in the second input pad PI2. The second circuit pad PD-M2 may be also electrically connected to the vertical arrangement pads PI-V in the second input pad PI2. That is, the second circuit width W2-*a* of the second circuit pad PD-M2 may be substantially the same as the second width W2 of the second input pad PI2, and the second circuit pad PD-M2 may be electrically connected to all of the power pad PI-P, the first vertical arrangement pad PI2-1, the second vertical arrangement pad PI2-2 and the third vertical arrangement pad PI2-3. The second circuit pad PD-M2 may overlap the power pad PI-P, the first vertical arrangement pad PI2-1, the second vertical arrangement pad PI2-2 and the third vertical arrangement pad PI2-3 on a plane.

In one or more embodiment of the display device DD, as the second circuit pad PD-M2 among the plurality of circuit pads PD-M in the main circuit board MPCB which corresponds to all the pads parts of the second input pad PI2 in the connection circuit board FPCB may have a width greater than that of each of the plurality of first circuit pads PD-M1 and overlap all of the vertical arrangement pads PI-V and the power pad PI-P in the second input pad PI2 on the plane, the connection characteristic of the power pad PI-P may further improve, and the reliability of the display device DD may further improve.

According to one or more embodiment, since the gap between the pads disposed in the input pad row PI-A may increase, the defect such as short-circuit between the pads may be reduced or effectively prevented, and the connection characteristic between the pads may be secured. Thus, the display device DD including one or more embodiment of the connection circuit board FPCB may have the improved reliability.

Although embodiments of the invention have been described, it is understood that the invention should not be limited to these embodiments but various changes and modifications can be made by one ordinary skilled in the art within the spirit and scope of the invention as hereinafter claimed.

Hence, the real protective scope of the invention shall be determined by the technical scope of the accompanying claims.

What is claimed is:
1. A display device comprising:
a display panel comprising an edge extending along a first direction; and
a connection circuit board which is connected to the display panel at the edge thereof,
wherein
the connection circuit board comprises a plurality of board side pads which are arranged along the first direction,
each of the plurality of board side pads comprises:
a first pad; and
a second pad adjacent to the first pad along the first direction,
wherein the second pad comprises a plurality of signal pads which are arranged along a second direction which crosses the first direction and are each aligned with the first pad along the first direction, and within the connection circuit board,
each of the plurality of board side pads comprises a first virtual line and a second virtual line spaced apart from each other along the second direction and each extended along the first direction,
within each of the plurality of board side pads, the first pad corresponds to both the first virtual line and the second virtual line, and
among the plurality of signal pads within the second pad:
a first signal pad corresponds to the first virtual line and is spaced apart from the second virtual line,
a second signal pad corresponds to the second virtual line and is spaced apart from the first virtual line, and
an additional signal pad is aligned with the first signal pad and the second signal pad along the second direction and is spaced apart from both the first virtual line and the second virtual line, the additional signal pad comprising:
a first pad portion between the first signal pad and the second signal pad along the second direction; and
a second pad portion which is connected to the first pad portion and spaced apart from the first signal pad with the second signal pad therebetween along the second direction.

2. The display device of claim 1, further comprising:
a main circuit board which is adjacent to the edge of the display panel and provides an electrical signal,
wherein
the display panel further comprises a display pad which is at the edge of the display panel,
the connection circuit board further comprises a panel side pad, and
the electrical signal is provided from the main circuit board to the connection circuit board through the plurality of board side pads and is provided from the panel side pad of the connection circuit board to the display panel through the display pad.

3. The display device of claim 2, wherein
the main circuit board comprises a plurality of circuit pads respectively corresponding to the plurality of board side pads of the connection circuit board, each of the plurality of circuit pads comprising:
a first circuit pad corresponding to the first pad of the connection circuit board; and
a second circuit pad corresponding to the second pad of the connection circuit board,
each of the first circuit pad and the second circuit pad of the main circuit board has a width along the first direction, and
the width of the second circuit pad is greater than the width of the first circuit pad.

4. The display device of claim 3, wherein the second circuit pad of the main circuit board corresponds to each of the plurality of signal pads of the second pad which are arranged along the second direction.

5. The display device of claim 2, wherein
the main circuit board provides a power voltage, and
the additional signal pad is a power pad which receives the power voltage from the main circuit board and defines one of the plurality of signal pads within the second pad which has a planar area equal to or greater than a planar area of the first pad.

6. The display device of claim 5, wherein within the connection circuit board,
each of the first pad and the additional signal pad within the second pad has a length along the second direction, and
the length of the additional signal pad is less than the length of the first pad.

7. The display device of claim 1, wherein within each of the plurality of board side pads of the connection circuit board, each of the plurality of signal pads comprises:
a connection portion extending along the second direction; and
a pad portion extending from the connection portion along the first direction.

8. The display device of claim 3, wherein the plurality of signal pads comprises:
the first signal pad comprising:
a first connection portion extending along the second direction; and
a first pad portion extending from the first connection portion along the first direction, corresponding to the first virtual line and spaced apart from the second virtual line, and
the second signal pad comprising:
a second connection portion extending along the second direction; and
a second pad portion extending from the second connection portion along the first direction, corresponding to the second virtual line and spaced apart from the first virtual line.

9. The display device of claim 8, wherein
the additional signal pad defines one of the plurality of signal pads within the second pad which has a planar area equal to or greater than a planar area of the first pad.

10. The display device of claim 8, wherein within each of the plurality of board side pads of the connection circuit board,
each of the first signal pad and the second signal pad has a length along the second direction, and
the length of the first signal pad is greater than the length of the second signal pad.

11. The display device of claim 8, wherein within the connection circuit board,
each of the plurality of board side pads comprises a third virtual line which is spaced apart from both the first virtual line and the second virtual line along the second direction and extended along the first direction, and
within the second pad, the plurality of signal pads further comprises:
a third signal pad spaced apart from both the first signal pad and the second pad along the second direction, and
the third signal pad comprising:
a third connection portion extending along the second direction; and
a third pad portion extending from the third connection portion along the first direction, corresponding to the third virtual line and spaced apart from each of the first virtual line and the second virtual line.

12. The display device of claim 1, wherein within each of the plurality of board side pads of the connection circuit board,
each of the first pad and the second pad has a width along the first direction, and
the width of the second pad is greater than the width of the first pad.

13. The display device of claim 1, wherein
each of the first pad and the additional signal pad has a width along the first direction,
the width of the additional signal pad is greater than the width of the first pad, and
the additional signal pad defines one of the plurality of signal pads within the second pad which has a planar area equal to or greater than a planar area of the first pad.

14. The display device of claim 1, wherein the connection circuit board further comprises:
a driving circuit; and
a plurality of signal lines which connects the driving circuit to the plurality of board side pads.

15. The display device of claim 1, wherein within each of the plurality of board side pads of the connection circuit board,
each of the first pad and each of the plurality of signal pads within the second pad has a length along the second direction, and
the length of each of the plurality of signal pads is less than the length of the first pad.

16. A display device comprising:
a display panel comprising an edge extending along a first direction; and a connection circuit board which is connected to the display panel at the edge thereof, wherein the connection circuit board comprises a plurality of board side pads which are arranged along the first direction, each of the plurality of board side pads comprises:

a first pad; and a second pad adjacent to the first pad along the first direction, wherein the second pad comprises a plurality of signal pads which are arranged along a second direction which crosses the first direction and are each aligned with the first pad along the first direction, and each of the plurality of signal pads within the second pad has a width along the first direction which is greater than a width along the first direction of the first pad.

17. A display device comprising:

a display panel comprising an edge extending along a first direction;

a main circuit board adjacent to the edge of the display panel; and a connection circuit board which connects the main circuit board to the display panel at the edge thereof, wherein the connection circuit board comprises a plurality of board side pads which are arranged along the first direction and at which the connection circuit board is connected to the main circuit board, each of the plurality of board side pads comprises:

a first pad; and a second pad adjacent to the first pad along the first direction, wherein the second pad comprises a plurality of signal pads which are arranged along a second direction which crosses the first direction and are each aligned with the first pad along the first direction, and the main circuit board comprises a plurality of circuit pads respectively corresponding to the plurality of board side pads of the connection circuit board, each of the plurality of circuit pads comprising:

a first circuit pad corresponding to the first pad of the connection circuit board; and a second circuit pad corresponding to the second pad of the connection circuit board, each of the first circuit pad and the second circuit pad of the main circuit board has a width along the first direction, and the width of the second circuit pad is greater than the width of the first circuit pad.

* * * * *